(12) United States Patent
Ito et al.

(10) Patent No.: US 10,896,811 B2
(45) Date of Patent: Jan. 19, 2021

(54) ANTENNA DEVICE, RADIATION METHOD OF ELECTROMAGNETIC WAVES, PLASMA PROCESSING APPARATUS, AND PLASMA PROCESSING METHOD

(71) Applicant: Tokyo Electron Limited, Tokyo (JP)

(72) Inventors: Ayako Ito, Miyagi (JP); Koji Koyama, Miyagi (JP); Yuki Kawada, Miyagi (JP); Takahiro Senda, Miyagi (JP); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/552,372

(22) Filed: Aug. 27, 2019

(65) Prior Publication Data
US 2020/0075292 A1 Mar. 5, 2020

(30) Foreign Application Priority Data

Aug. 30, 2018 (JP) .................................. 2018-161864
Mar. 14, 2019 (JP) .................................. 2019-046849

(51) Int. Cl.
*H01J 37/32* (2006.01)
*H05H 1/24* (2006.01)
*H01P 1/08* (2006.01)

(52) U.S. Cl.
CPC .... *H01J 37/32238* (2013.01); *H01J 37/3222* (2013.01); *H01J 37/32229* (2013.01); *H01P 1/08* (2013.01); *H05H 1/24* (2013.01)

(58) Field of Classification Search
CPC ........ H05H 1/24; H01P 1/08; H01J 37/32238; H01J 37/3222; H01J 37/32229; H01J 37/32935
See application file for complete search history.

(56) References Cited

U.S. PATENT DOCUMENTS

| 6,388,632 | B1 * | 5/2002 | Murakawa | ........ H01J 37/32192 |
| | | | | 118/723 MW |
| 8,171,880 | B2 * | 5/2012 | Nishimoto | ........ H01J 37/32192 |
| | | | | 118/723 MW |
| 9,155,183 | B2 * | 10/2015 | Voronin | .................... H05H 1/46 |
| 10,553,402 | B2 * | 2/2020 | Kawada | .............. H01J 37/3222 |

(Continued)

FOREIGN PATENT DOCUMENTS

| JP | 2003-188152 A | 7/2003 |
| JP | 2008-251660 A | 10/2008 |

(Continued)

*Primary Examiner* — Borna Alaeddini
(74) *Attorney, Agent, or Firm* — Studebaker & Brackett PC

(57) ABSTRACT

In one exemplary embodiment, a second waveguide is connected to an upper wall of a first waveguide and communicates with the first waveguide, a dielectric window is in contact with a lower wall of the first waveguide, a first inner conductor penetrates an upper wall, is electrically connected with the upper wall, and extends along the direction of a tube axis from an inside of the first waveguide to an inside of a third waveguide, the third waveguide is connected to the lower wall on the dielectric window side and communicates with the first waveguide, a first opening end of the third waveguide is connected to the dielectric window, and a drive device is connected to the first inner conductor, and is configured to drive the first inner conductor in the direction of the tube axis.

18 Claims, 21 Drawing Sheets

(56) References Cited

U.S. PATENT DOCUMENTS

| | | | | |
|---|---|---|---|---|
| 2007/0079936 A1* | 4/2007 | Li | .................. | C04B 37/005 |
| | | | | 156/345.48 |
| 2010/0096362 A1* | 4/2010 | Hirayama | ......... | H01J 37/32192 |
| | | | | 216/69 |
| 2011/0174778 A1* | 7/2011 | Sawada | ............. | H01J 37/32165 |
| | | | | 216/68 |
| 2014/0174660 A1* | 6/2014 | Iwasaki | ............. | H01J 37/32211 |
| | | | | 156/345.42 |

FOREIGN PATENT DOCUMENTS

| | | | |
|---|---|---|---|
| JP | 2012-216631 | A | 11/2012 |
| JP | 2013-016443 | A | 1/2013 |
| JP | 2014-075234 | A | 4/2014 |
| JP | 2015-130325 | A | 7/2015 |
| WO | 2008/153053 | A1 | 12/2008 |

* cited by examiner

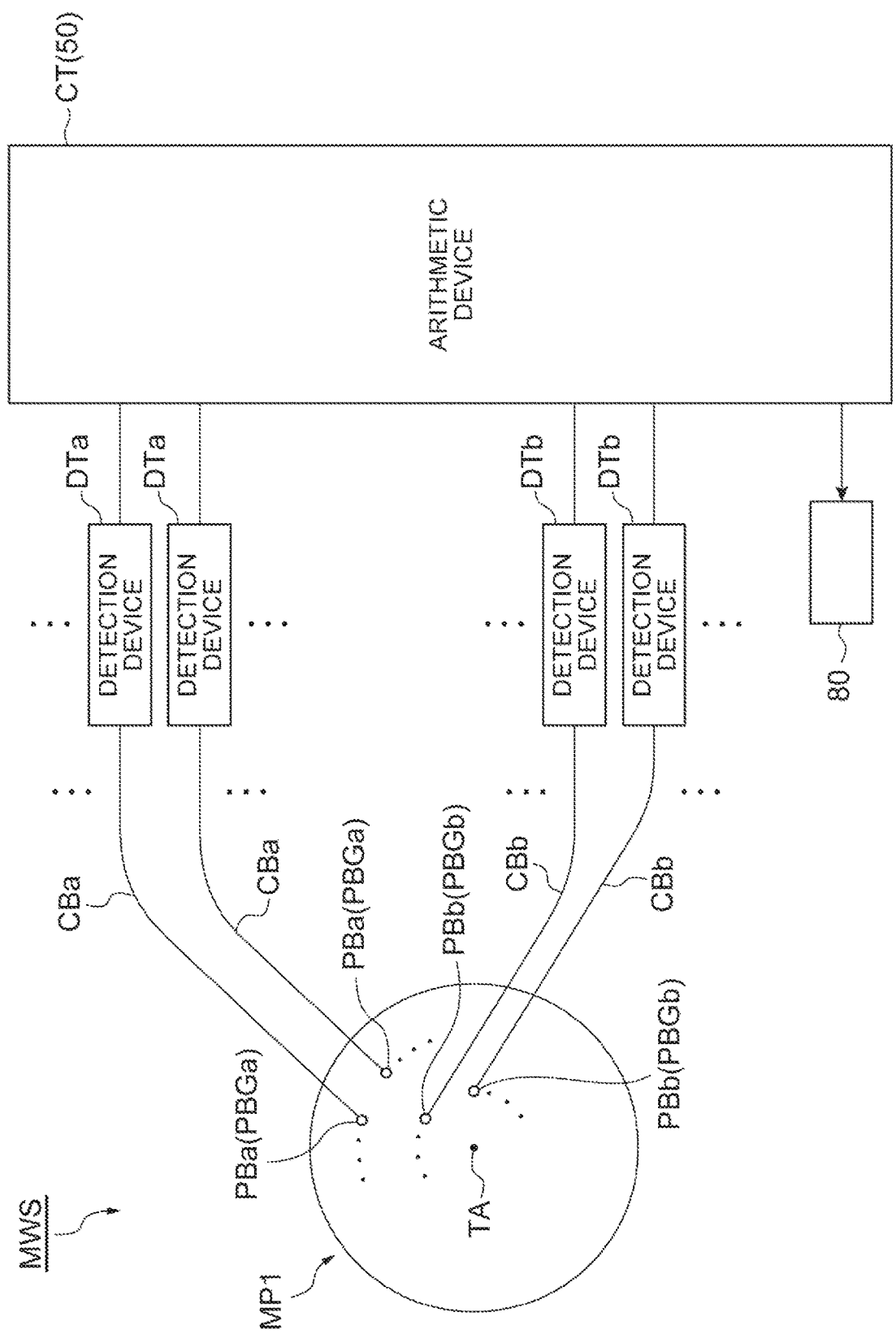

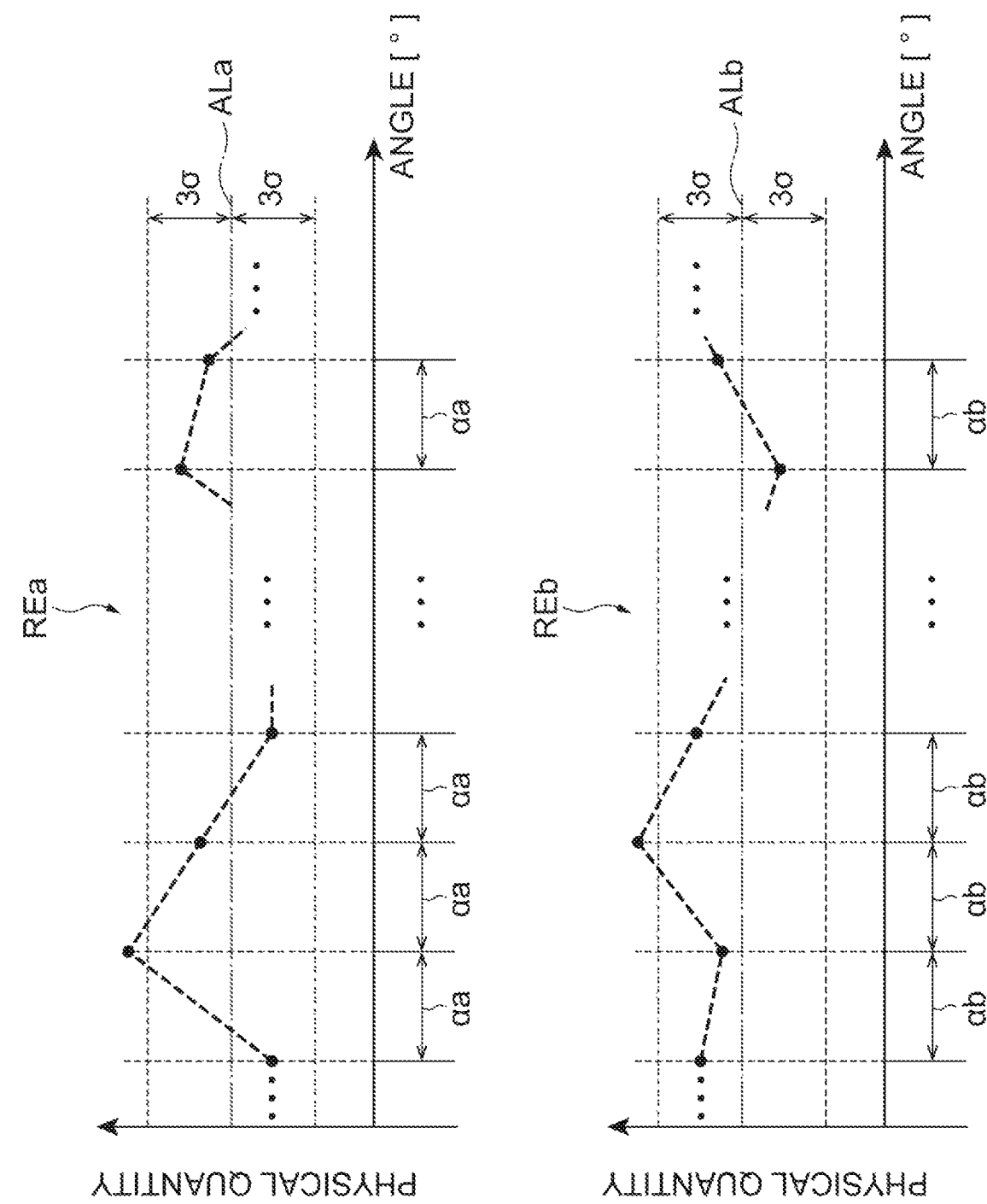

ANTENNA DEVICE, RADIATION METHOD OF ELECTROMAGNETIC WAVES, PLASMA PROCESSING APPARATUS, AND PLASMA PROCESSING METHOD

CROSS-REFERENCE TO RELATED APPLICATIONS

This application is based on and claims the benefit of priority from Japanese Patent Application Nos. 2018-161864 and 2019-046849 filed on Aug. 30, 2018 and Mar. 14, 2019, respectively, with the Japan Patent Office, the entire contents of which are incorporated herein by reference.

TECHNICAL FIELD

Exemplary embodiments of the present disclosure relate to an antenna device, a radiation method of electromagnetic waves, a plasma processing apparatus, and a plasma processing method.

BACKGROUND

There is a case where plasma processing apparatuses for performing film fonnation, etching, or the like on a semiconductor wafer use various antennas such as a radial line slot antenna (RLSA). Such a plasma processing apparatus can generate plasma in a processing container with the wafer accommodated therein (Republished Japanese Translation No. 2008-153053 for PCT International Publication, Japanese Unexamined Patent Publication No. 2008-251660, Japanese Unexamined Patent Publication No. 2013-16443, Japanese Unexamined Patent Publication No. 2012-216631, Japanese Unexamined Patent Publication No. 2014-075234, Japanese Unexamined Patent Publication No. 2003-188152, and Japanese Unexamined Patent Publication No. 2015-130325).

SUMMARY

According to one exemplary embodiment, an antenna device is provided. The antenna device is configured to radiate electromagnetic waves. The antenna device includes a first waveguide, a second waveguide, a third waveguide, a dielectric window, a first inner conductor, and a drive device. The second waveguide is connected to an upper wall of the first waveguide. The second waveguide communicates with the first waveguide. The dielectric window is in contact with a lower wall of the first waveguide. The first waveguide is provided between the dielectric window and the second waveguide. The first waveguide extends in a direction crossing a tube axis of the second waveguide. The first inner conductor penetrates the upper wall and is electrically connected with the upper wall. The first inner conductor extends along a direction of the tube axis from an inside of the first waveguide to an inside of the third waveguide. A first end of the first inner conductor is positioned at a center of the third waveguide, in a surface crossing the tube axis. The third waveguide is connected to the lower wall on the dielectric window side. The third waveguide communicates with the first waveguide. A first opening end of the third waveguide is connected to the dielectric window. The drive device is connected to the first inner conductor. The drive device is configured to drive the first inner conductor in the direction of the tube axis.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 18 is a sectional view schematically illustrating a configuration of a part of the antenna device according to one exemplary embodiment.

FIG. 21 is a view illustrating an example of a distribution of a physical quantity detected by the plurality of the probes illustrated in FIG. 18.

DETAILED DESCRIPTION

Figure 1:
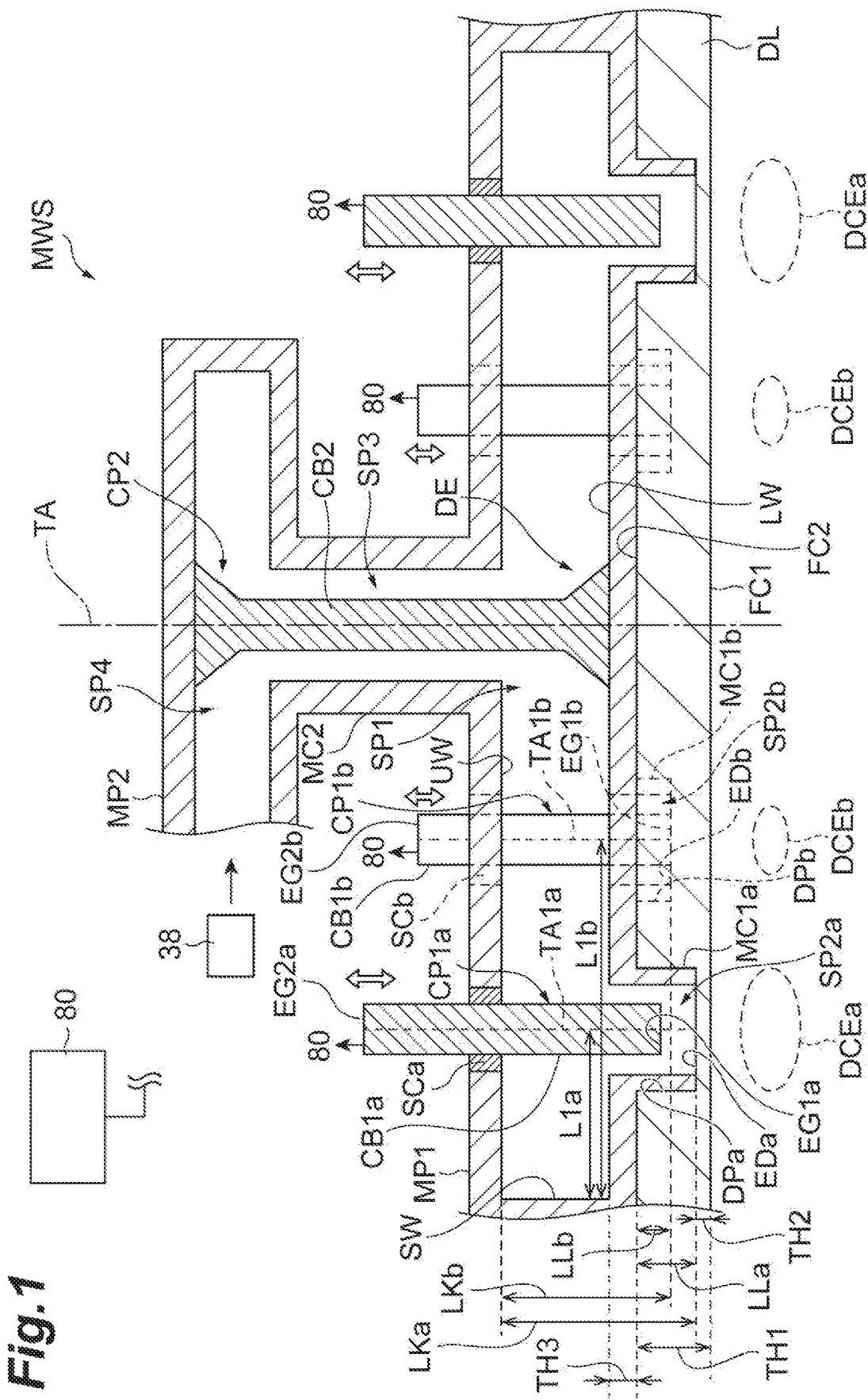
FIG. 1 is a sectional view schematically illustrating a configuration of an antenna device according to one exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

The present disclosure provides a technique of flexibly adjusting electric field strength by electromagnetic waves radiated in a plasma processing apparatus.

Description of Exemplary Embodiments of Present Disclosure

First, various exemplary embodiments of the present disclosure will be listed and described. According to one exemplary embodiment, an antenna device is provided. The antenna device is configured to radiate electromagnetic waves. The antenna device includes a first waveguide, a second waveguide, a third waveguide, a dielectric window, a first inner conductor, and a drive device. The second waveguide is connected to an upper wall of the first waveguide. The second waveguide communicates with the first waveguide. The dielectric window is in contact with a lower wall of the first waveguide. The first waveguide is provided between the dielectric window and the second waveguide. The first waveguide extends in a direction crossing a tube axis of the second waveguide. The first inner conductor penetrates the upper wall and is electrically connected with the upper wall. The first inner conductor extends along a direction of the tube axis from an inside of the first waveguide to an inside of the third waveguide. A first end of the first inner conductor is positioned at a center of the third waveguide, in a surface crossing the tube axis. The third waveguide is connected to the lower wall on the dielectric window side. The third waveguide communicates with the first waveguide. A first opening end of the third waveguide is connected to the dielectric window. The drive device is connected to the first inner conductor. The drive device is configured to drive the first inner conductor in the direction of the tube axis. The electric field strength by the electromagnetic waves radiated from the first inner conductor can be adjusted by driving the first inner conductor in the direction of the tube axis. Thus, the distribution of the plasma density can be flexibly changed according to process conditions.

In one exemplary embodiment, the drive device is configured to change a gap between the first end of the first inner conductor and the dielectric window by driving the first inner conductor in the direction of the tube axis.

In one exemplary embodiment, the antenna device includes a plurality of the third waveguides and a plurality of the first inner conductors. The plurality of the third waveguides and the plurality of the first inner conductors are disposed in a concentric circular shape when viewed from the tube axis.

In one exemplary embodiment, the drive device is configured to drive each of the plurality of the first inner conductors in the direction of the tube axis in a synchronization manner.

In one exemplary embodiment, the drive device is configured to drive each of the plurality of the first inner conductors in the direction of the tube axis in an independent manner.

In one exemplary embodiment, the antenna device may further include a fourth waveguide and a second inner conductor. The fourth waveguide is connected to the lower wall on the dielectric window side. The fourth waveguide communicates with the first waveguide. The second inner conductor extends along the direction of the tube axis from the inside of the first waveguide to an inside of the fourth waveguide. A third end of the second inner conductor is in contact with the dielectric window through a second opening end of the fourth waveguide. The second opening end is connected to the dielectric window. A fourth end of the second inner conductor is in contact with the upper wall. The electric field strength by the electromagnetic waves radiated from the first inner conductor can be adjusted by driving the first inner conductor in the direction of the tube axis. The electromagnetic waves radiated from the second inner conductor can be varied by the driving of the first inner conductor. Thus, the distribution of the plasma density can be more flexibly changed according to process conditions.

In one exemplary embodiment, the antenna device may further include a fourth waveguide and a second inner conductor. The fourth waveguide is connected to the lower wall on the dielectric window side. The fourth waveguide communicates with the first waveguide. The second inner conductor penetrates the upper wall and is electrically connected with the upper wall. The second inner conductor extends along the direction of the tube axis from the inside of the first waveguide to an inside of the fourth waveguide. The third end of the second inner conductor is positioned at a center of the fourth waveguide, in a surface crossing the tube axis. The second opening end of the fourth waveguide is connected to the dielectric window. The drive device is connected to the second inner conductor. The drive device is configured to drive the second inner conductor in the direction of the tube axis. The electric field strength by the electromagnetic waves radiated from the first inner conductor and the electric field strength by the electromagnetic waves radiated from the second inner conductor can be adjusted by driving each of the first inner conductor and the second inner conductor in the direction of the tube axis.

Thus, the distribution of the plasma density can be more flexibly changed according to process conditions.

In one exemplary embodiment, the drive device is configured to change a gap between the third end of the second inner conductor and the dielectric window by driving the second inner conductor in the direction of the tube axis.

In one exemplary embodiment, the antenna device includes a plurality of the fourth waveguides and a plurality of the second inner conductors. The plurality of the fourth waveguides and the plurality of the second inner conductors are disposed in a concentric circular shape when viewed from the tube axis.

In one exemplary embodiment, the drive device is configured to drive each of the plurality of the second inner conductors in the direction of the tube axis in a synchronization manner.

In one exemplary embodiment, the drive device is configured to drive each of the plurality of the second inner conductors in the direction of the tube axis in an independent manner.

In one exemplary embodiment, the first waveguide includes a dispersion part and a coaxial conversion part. The dispersion part is disposed on the tube axis and on the lower wall in the first waveguide. The dispersion part disperses electromagnetic waves guided along the tube axis by the second waveguide in the direction crossing the tube axis in the first waveguide. The coaxial conversion part is included in the first inner conductor in the first waveguide. The coaxial conversion part causes propagation of the electromagnetic waves, which are dispersed by the dispersion part and reach the first inner conductor, to be directed toward the dielectric window.

In one exemplary embodiment, the first waveguide includes a dispersion part and a coaxial conversion part. The dispersion part is disposed on the tube axis and on the lower wall in the first waveguide. The dispersion part disperses electromagnetic waves guided along the tube axis by the second waveguide in the direction crossing the tube axis in the first waveguide. The coaxial conversion part is included in at least one of the first inner conductor and the second inner conductor in the first waveguide. The coaxial conversion part causes propagation of the electromagnetic waves, which are dispersed by the dispersion part and reach the first inner conductor or the second inner conductor including the coaxial conversion part, to be directed toward the dielectric window.

In one exemplary embodiment, a probe group is further included. The probe group includes a plurality of probes which are electric conductors. The probe group is provided in the first waveguide or the third waveguide. The probe group is used to detect a physical quantity that is used for plasma generation and is present around the first waveguide or the third waveguide. The plurality of the probes are disposed in a concentric circular shape when viewed from the tube axis.

In one exemplary embodiment, a probe group is further included. The probe group includes a plurality of probes which are electric conductors. The probe group is provided in the first waveguide, the third waveguide, or the fourth waveguide. The probe group is used to detect a physical quantity that is used for plasma generation and is present around the first waveguide, the third waveguide, or the fourth waveguide. The plurality of the probes are disposed in a concentric circular shape when viewed from the tube axis.

In one exemplary embodiment, an arithmetic device is further included. The arithmetic device is configured to acquire a distribution of a physical quantity on the basis of a plurality of values of the physical quantity detected by the probe group.

In one exemplary embodiment, the arithmetic device is configured to control the drive device on the basis of the acquired distribution of the physical quantity.

In one exemplary embodiment, a plasma processing apparatus is provided. The plasma processing apparatus includes any one of the above-described antenna devices.

In one exemplary embodiment, a radiation method of electromagnetic waves is provided. This method includes: causing propagation of electromagnetic waves that are transmitted to a waveguide to be directed toward a dielectric window provided on a lower wall of the waveguide by an inner conductor provided in the waveguide, and radiating the electromagnetic waves from the dielectric window; and adjusting a gap between the inner conductor and the dielectric window. The adjusting of the gap is executed before the causing of the propagation to be directed toward the dielectric window or during the causing of the propagation to be directed toward the dielectric window. The electric field strength by the electromagnetic waves radiated from the inner conductor can be adjusted by adjusting the gap between the inner conductor and the dielectric window. Thus, the distribution of the plasma density can be more flexibly changed according to process conditions.

In one exemplary embodiment, a plasma processing method is provided. This method uses the above-described radiation method of electromagnetic waves.

DETAILS OF EXEMPLARY EMBODIMENTS OF PRESENT DISCLOSURE

Hereinafter, various exemplary embodiments will be described in detail with reference to the drawings. In each drawing, identical or corresponding portions are denoted by the same reference numerals.

First Exemplary Embodiment

Figure 2:
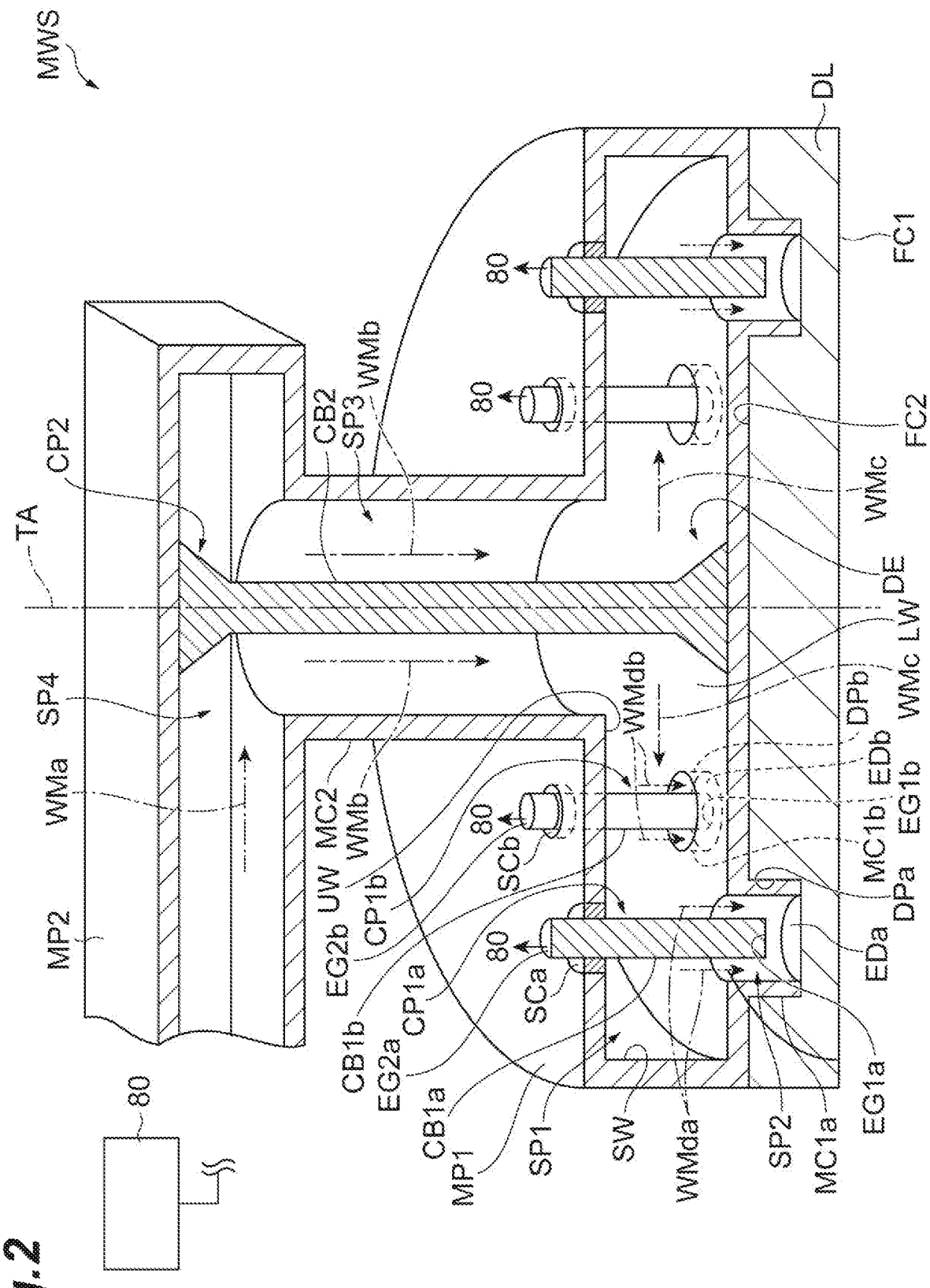
FIG. 2 is a diagram for describing the configuration of the antenna device illustrated in FIG. 1.
Figure 3:
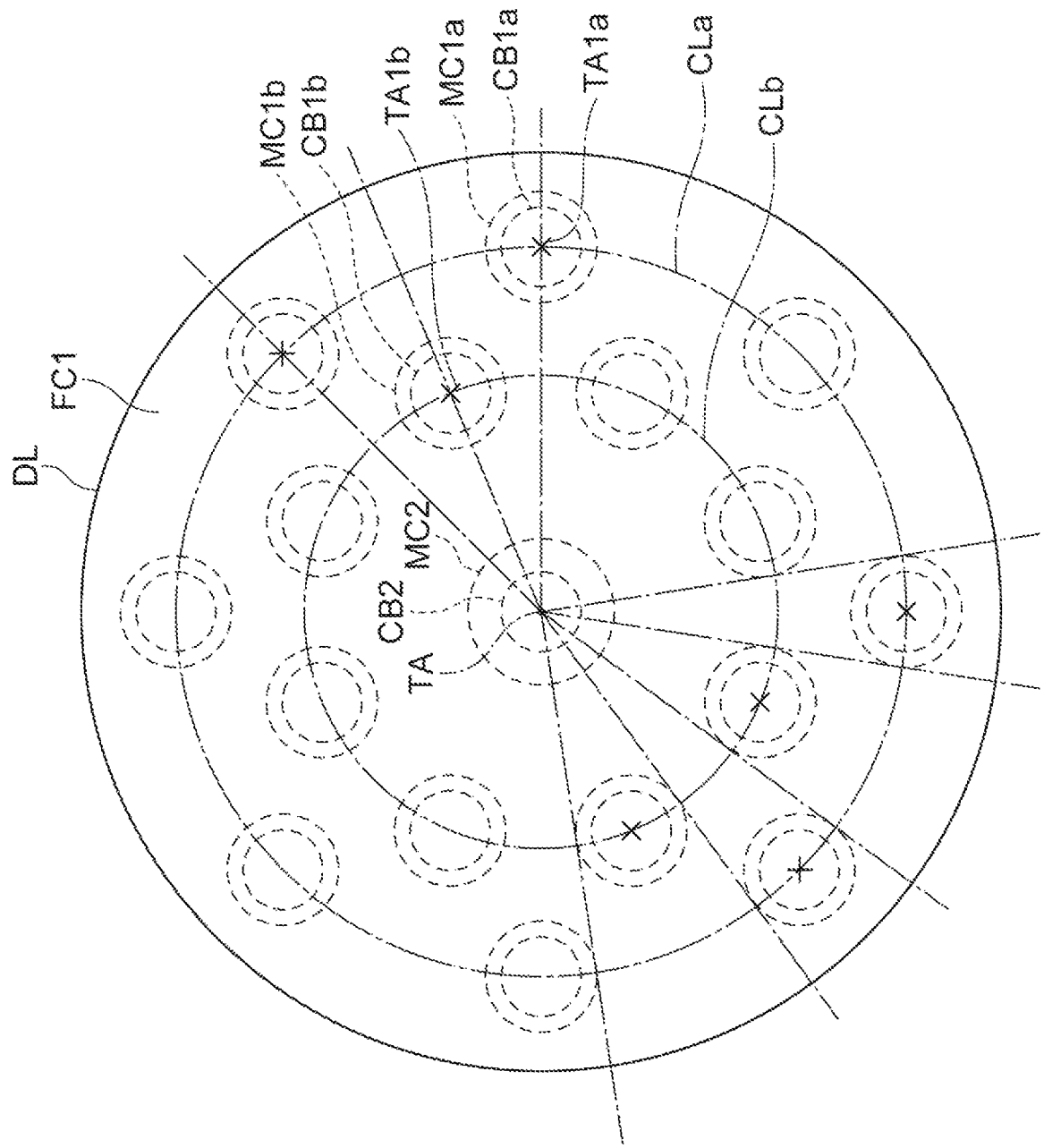
FIG. 3 is a view illustrating positions of inner conductors of the antenna device illustrated in FIG. 1.

An antenna device MWS according to one exemplary embodiment will be described with reference to FIGS. 1 to 3. FIG. 1 is a sectional view schematically illustrating a configuration of the antenna device MWS according to one exemplary embodiment. FIG. 2 is a diagram for describing the configuration of the antenna device MWS illustrated in FIG. 1. FIG. 3 is a view illustrating positions of an inner conductor CB1$a$ and an inner conductor CB1$b$ of the antenna device MWS illustrated in FIG. 1.

As illustrated in FIG. 1, the antenna device MWS can radiate electromagnetic waves (microwaves) in, for example, the TEM mode to an electric discharge area DCEa, an electric discharge area DCEb, or the like by a coaxial structure. The electromagnetic waves which are radiated by the antenna device MWS are supplied from an electromagnetic wave generation system 38 illustrated in FIG. 4 which will be described later.

The antenna device MWS includes a distribution waveguide MP1 (a first waveguide), a coaxial waveguide MC2 (a second waveguide), a coaxial waveguide MC1$a$ (a third waveguide), and a coaxial waveguide MC1$b$ (a fourth waveguide). The antenna device MWS includes a dielectric window DL, the inner conductor CB1$a$ (a first inner conductor), the inner conductor CB1$b$ (a second inner conductor), and a drive device 80. The inner conductor CB1$a$ is an inner conductor disposed on the outer periphery side of the distribution waveguide MP1, and the inner conductor CB1$b$ is an inner conductor disposed to be closer to the central side of the distribution waveguide MP1 than the inner conductor CB1a. A material of each of the distribution waveguide MP1, the coaxial waveguide MC2, the coaxial waveguide MC1a, the coaxial waveguide MC1b, the inner conductor CB1a, and the inner conductor CB1b includes metal having conductivity.

The distribution waveguide MP1 is provided between the dielectric window DL and the coaxial waveguide MC2. The distribution waveguide MP1 extends in a direction crossing a tube axis TA of the coaxial waveguide MC2. The distribution waveguide MP1 has an upper wall UW, a lower wall LW, and a side wall SW.

The upper wall UW and the lower wall LW face each other. The side wall SW connects an edge of the upper wall UW and an edge of the lower wall LW. An intra-tube space SP1 of the distribution waveguide MP1 is defined by the upper wall UW, the lower wall LW, and the side wall SW.

The distribution waveguide MP1 includes a dispersion part DE. The dispersion part DE is disposed on the tube axis TA of the coaxial waveguide MC2 and on the lower wall LW in the distribution waveguide MP1. The dispersion part DE can disperse electromagnetic waves, which are guided along the tube axis TA by the coaxial waveguide MC2, in the direction crossing the tube axis TA in the distribution waveguide MP1. More specifically, the dispersion part DE changes a traveling direction WMb to a traveling direction WMc, as illustrated in FIG. 2.

The traveling direction WMb is a traveling direction of the electromagnetic waves which are guided along the tube axis TA by the coaxial waveguide MC2. The traveling direction WMc is a traveling direction crossing the tube axis TA in the distribution waveguide MP1. The traveling direction WMc is a direction directed toward the inner conductor CB1a, the inner conductor CB1b, and the side wall SW of the distribution waveguide MP1 from the dispersion part DE.

The dispersion part DE includes a portion made of metal, and this portion has a shape such as a cone (or a truncated cone), for example. The dispersion part DE can be included in an inner conductor CB2 (a third inner conductor), which will be described later.

The coaxial waveguide MC1a is connected to the lower wall LW on the dielectric window DL side. The coaxial waveguide MC1a communicates with the distribution waveguide MN. More specifically, an intra-tube space SP2a of the coaxial waveguide MC1a communicates with the intra-tube space SP1 of the distribution waveguide MP1. The coaxial waveguide MC1a has an opening end EDa (a first opening end). The opening end EDa is connected to the dielectric window DL.

The coaxial waveguide MC1b is connected to the lower wall LW on the dielectric window DL side. The coaxial waveguide MC1b communicates with the distribution waveguide MP1. More specifically, an intra-tube space SP2b of the coaxial waveguide MC1b communicates with the intra-tube space SP1 of the distribution waveguide MP1. The coaxial waveguide MC1b has an opening end EDb (a second opening end). The opening end EDb is connected to the dielectric window DL.

The inner conductor CB1a extends from an inside of the distribution waveguide MP1 to an inside of the coaxial waveguide MC1a along the direction of the tube axis TA. The inner conductor CB1a has an end EG1a (a first end) and an end EG2a (a second end).

The inner conductor CB1b extends from the inside of the distribution waveguide MP1 to an inside of the coaxial waveguide MC1b along the direction of the tube axis TA. The inner conductor CB1b has an end EG1b (a third end) and an end EG2b (a fourth end).

A central axis TA1a (a first central axis) of the inner conductor CB1a and a central axis TA1b (a second central axis) of the inner conductor CB1b extend along the tube axis TA. The distance between the central axis TA1a and the tube axis TA is longer than the distance between the central axis TA1b and the tube axis TA. The central axis TA1a can overlap the tube axis of the coaxial waveguide MC1a. The central axis TA1b can overlap the tube axis of the coaxial waveguide MC1b.

The end EG1a of the inner conductor CB1a is positioned at a center of the coaxial waveguide MC1a, in a surface crossing the tube axis TA. The inner conductor CB1a penetrates the upper wall UW and is electrically connected with the upper wall UW via a slide contact SCa provided in the upper wall UW. A material of the slide contact SCa includes metal having conductivity.

The drive device 80 is connected to the inner conductor CB1a, and is configured to drive the inner conductor CB1a in the direction of the tube axis TA (direction of the central axis TA1a). The drive device 80 is configured to change a gap between the end EG1a of the inner conductor CB1a and the dielectric window DL by driving the inner conductor CB1a in the direction of the tube axis TA (direction of the central axis TA1a).

The drive device 80 is configured to drive each of the plurality of inner conductors CB1a in the direction of the tube axis TA (direction of the central axis TA1a) in a synchronization manner. The drive device 80 is configured to drive each of the plurality of the inner conductors CB1a in the direction of the tube axis TA (direction of the central axis TA1a) in an independent manner.

The end EG1b of the inner conductor CB1b is positioned at a center of the coaxial waveguide MC1b, in a surface crossing the tube axis TA.

The inner conductor CB1b penetrates the upper wall UW and is electrically connected with the upper wall UW via a slide contact SCb provided in the upper wall UW. A material of the slide contact SCb includes metal having conductivity.

The drive device 80 is connected to the inner conductor CB1b, and is configured to drive the inner conductor CB1b in the direction of the tube axis TA (direction of the central axis TA1b). The drive device 80 is configured to change a gap between the end EG1b of the inner conductor CB1b and the dielectric window DL by driving the inner conductor CB1b in the direction of the tube axis TA (direction of the central axis TA1b).

The drive device 80 is configured to drive each of the plurality of inner conductors CB1b in the direction of the tube axis TA (direction of the central axis TA1b) in a synchronization manner. The drive device 80 is configured to drive each of the plurality of the inner conductors CB1b in the direction of the tube axis TA (direction of the central axis TA1b) in an independent manner.

The coaxial conversion part is included in at least one of the inner conductor CB1a and the inner conductor CB1b in the distribution waveguide MP1. The coaxial conversion part causes propagation of the electromagnetic waves, which are dispersed by the dispersion part DE and reach the inner conductor CB1a or the inner conductor CB1b including the coaxial conversion part, to be directed toward the dielectric window DL.

For example, the distribution waveguide MN includes a coaxial conversion part CP1a. The coaxial conversion part CP1a is included in the inner conductor CB1a in the distribution waveguide MP1. The coaxial conversion part CP1a can cause the propagation of the electromagnetic waves, which are dispersed by the dispersion part DE and reach the inner conductor CB1a, to be directed toward the dielectric window DL. More specifically, the coaxial conversion part CP1a changes the traveling direction WMc to a traveling direction WMda, as illustrated in FIG. 2. The traveling direction WMc is a traveling direction of the electromagnetic waves which are dispersed by the dispersion part DE and reach the inner conductor CB1a. The traveling direction WMda is a traveling direction directed toward the opening end EDa of the coaxial waveguide MC1a along the inner conductor CB1a.

For example, the distribution waveguide MP1 includes a coaxial conversion part CP1b. The coaxial conversion part CP1b is included in the inner conductor CB1b in the distribution waveguide MP1. The coaxial conversion part CP can cause the propagation of the electromagnetic waves, which are dispersed by the dispersion part DE and reach the inner conductor CB1b, to be directed toward the dielectric window DL. More specifically, the coaxial conversion part CP1b changes the traveling direction WMc to a traveling direction WMdb, as illustrated in FIG. 2. The traveling direction WMdb is a traveling direction directed toward the opening end EDb of the coaxial waveguide MC1b along the inner conductor CB1b.

In the present disclosure, the drive device 80 is connected to the inner conductor CB1a and the inner conductor CB1b, and is configured to drive the inner conductor CB1a and the inner conductor CB1b, but the present disclosure is not limited thereto. That is, the drive device 80 is connected to any one of the inner conductor CB1a and the inner conductor CB1b, and can drive only one of the inner conductor CB1a and the inner conductor CB1b, which is connected to the drive device 80.

For example, a case where the drive device 80 is connected to only the inner conductor CB1a and is configured to drive only the inner conductor CB1a is assumed. In this case, the end EG1b of the inner conductor CB1b is in contact with the dielectric window DL through the opening end EDb, and the end EG2b of the inner conductor CB1b is in contact with the upper wall UW. Alternatively, the antenna device MWS may have a configuration in which the inner conductor CB1b, the coaxial waveguide MC1b, and the slide contact SCb are not provided.

For example, a case where the drive device 80 is connected to only the inner conductor CB1b and is configured to drive only the inner conductor CB1b is assumed. In this case, the end EG1a of the inner conductor CB1a is in contact with the dielectric window DL through the opening end EDa, and the end EG2a of the inner conductor CB1a is in contact with the upper wall UW. Alternatively, the antenna device MWS may have a configuration in which the inner conductor CB1a, the coaxial waveguide MC1a, and the slide contact SCa are not provided.

An electromagnetic wave is radiated from the opening end EDa to the electric discharge area DCEa on a front surface FC1 of the dielectric window DL. An electromagnetic wave is radiated from the opening end EDb to the electric discharge area DCEb on the front surface FC1 of the dielectric window DL.

The coaxial waveguide MC2 is connected to the upper wall UW of the distribution waveguide MP1. The coaxial waveguide MC2 communicates with the distribution waveguide MP1. More specifically, an intra-tube space SP3 of the coaxial waveguide MC2 communicates with the intra-tube space SP1 of the distribution waveguide MP1.

The coaxial waveguide MC2 virtually has the tube axis TA. The tube axis TA passes through approximately the center of the cross section of the coaxial waveguide MC2. The coaxial waveguide MC2 extends along the tube axis TA.

The dielectric window DL is in contact with the lower wall LW of the distribution waveguide MP1. The dielectric window DL extends along the distribution waveguide MP1 in the direction crossing the tube axis TA of the coaxial waveguide MC2. A material of the dielectric window DL can be, for example, quartz ($SiO_2$) or ceramic ($Al_2O_3$).

The dielectric window DL has the front surface FC1 and a back surface FC2. The front surface FC1 is disposed on the side opposite to the back surface FC2. The back surface FC2 is in contact with the distribution waveguide W1. The front surface FC1 extends in the direction crossing the tube axis TA. The front surface FC1 has a flat shape. A configuration for localizing the electromagnetic waves, for example, a configuration such as a groove or a recess (dimple) is not provided in the front surface FC1.

A distance LKa from the opening end EDa to the upper wall UW is a value of an odd multiple of a reference length set in advance. The reference length can be a value of a quarter of a wavelength $\lambda g$ of the electromagnetic wave which is introduced into the coaxial waveguide MC2 and propagates through the coaxial waveguide MC2 (hereinafter, the same). That is, the reference length=$\lambda g/4$. In the present disclosure, the equal sign (=) indicates that the left and right values of the equal sign are approximately the same, and does not indicate that the values are strictly the same.

It is preferable that a distance LKb from the opening end EDb to the upper wall UW is a value of an odd multiple of the reference length. However, there is no limitation. The distance LKa is not shorter than the distance LKb (is equal to or larger than the distance LKb) (LKb≤LKa). When each of m and n is an integer of 1 or more, LKa=($\lambda g/4$)×(2×m+1), LKb=($\lambda g/4$)×(2×n+1), and LKb≤LKa (n≤m).

In the dielectric window DL, the distance between the back surface FC2 and the front surface FC1 is a thickness TH1 of the dielectric window DL. The distance between the opening end EDa and the front surface FC1 is a thickness TH2 of the portion which is in contact with the coaxial waveguide MC1a, of the dielectric window DL.

The thickness TH1 is larger than the thickness TH2 (TH1>TH2). Alternatively, the thickness TH1 is substantially equal to the thickness TH2 (TH1=TH2). The distance between the back surface FC2 and the opening end EDa is set to be LLa, and the distance between the back surface FC2 and the opening end EDb is set to be LLb. In the case of TH1>TH2, LLa is a positive value (LLa>0), and LLb is a value equal to or larger than zero (LLb>0).

In the case of TH1>TH2 and LLb>0, the opening end EDa and the opening end EDb are located between the front surface FC1 and the back surface FC2. In a case where the distance LKa is longer than the distance LKb, that is, in the case of LKb<LKa, the distance LLa between the back surface FC2 and the opening end EDa is longer than the distance LLb between the back surface FC2 and the opening end EDb (LLa>LLb). Further, in a case where the distance LKa is equal to the distance LKb, that is, in the case of LKb=LKa, the distance LLa between the back surface FC2 and the opening end EDa is equal to the distance LLb between the back surface FC2 and the opening end EDb (LLa=LLb). The dielectric window DL includes, on the back surface FC2, a recessed portion DPa (a first recessed portion) which accommodates the coaxial waveguide MC1a and a recessed portion DPb (a second recessed portion) which accommodates the coaxial waveguide MC1b.

Also in the case of TH1>TH2 and LLb=0, the distance LLa between the back surface FC2 and the opening end EDa is longer than the distance LLb between the back surface FC2 and the opening end EDb (LLa>LLb=0). In this case, the dielectric window DL has the recessed portion DPa on the back surface FC2. However, the recessed portion DPb is not provided in the dielectric window DL. The opening end EDa is located between the front surface FC1 and the back surface FC2. The opening end EDb is located on the back surface FC2 or located in the lower wall LW.

The case of TH1=TH2 corresponds to a case where both of LLa and LLb are about zero (LLa=0=LLb). In this case, a thickness TH3 of the lower wall LW is substantially the same as the thickness of the upper wall UW, or the thickness TH3 of the lower wall LW is thicker than the thickness of the upper wall UW.

A distance L1a from the side wall SW of the distribution waveguide MP1 to the central axis TA1a of the inner conductor CB1a is the reference length. That is, the distance L1a (the reference length) satisfies the relationship, L1a=λg/4. Since the central axis TA1a of the inner conductor CB1a is disposed at the position of an antinode of a standing wave having a node formed on the side wall SW, efficient coaxial conversion becomes possible.

A distance L1b from the side wall SW of the distribution waveguide MP1 to the central axis TA1b of the inner conductor CB1b is an odd multiple of the reference length (three or more times). Since the central axis TA1b of the inner conductor CB1b is disposed at the position of an antinode of a standing wave having a node formed on the side wall SW, efficient coaxial conversion becomes possible.

The antenna device MWS further includes the inner conductor CB2. The inner conductor CB2 is disposed on the tube axis TA of the coaxial waveguide MC2 and extends from the inside of the coaxial waveguide MC2 to the inside of the distribution waveguide MP1. The inner conductor CB2 is disposed approximately at the center of the coaxial waveguide MC2 when viewed from the cross section of the coaxial waveguide MC2.

A material of the inner conductor CB2 includes metal having conductivity. As the material of the inner conductor CB2, for example, aluminum plated with silver can be used. However, a low resistance material can be used in a place thicker than a skin depth of the outermost surface.

The inner conductor CB2 includes the dispersion part DE. That is, the inner conductor CB2 is connected to the lower wall LW of the distribution waveguide MP1. The inner conductor CB2 extends from the lower wall LW toward above the lower wall LW and penetrates the coaxial waveguide MC2.

An introduction waveguide MP2 is provided on the coaxial waveguide MC2. The introduction waveguide MP2 is connected to an end portion of the coaxial waveguide MC2 and communicates with the coaxial waveguide MC2. More specifically, an intra-tube space SP4 of the introduction waveguide MP2 communicates with the intra-tube space SP3 of the coaxial waveguide MC2.

The inner conductor CB2 is connected to an inner wall of the introduction waveguide MP2. The inner conductor CB2 extends from the inner wall of the introduction waveguide MP2 toward the coaxial waveguide MC2.

The inner conductor CB2 further extends inside the coaxial waveguide MC2 along the tube axis TA of the coaxial waveguide MC2 to penetrate the coaxial waveguide MC2. The inner conductor CB2 is connected to the lower wall LW of the distribution waveguide MP1.

The introduction waveguide MP2 includes a coaxial conversion part CP2. The coaxial conversion part CP2 is included in the inner conductor CB2 in the introduction waveguide MP2. The coaxial conversion part CP2 can cause the propagation of the electromagnetic waves from the electromagnetic wave generation system 38 to be directed in the direction along the tube axis TA of the coaxial waveguide MC2. More specifically, the coaxial conversion part CP2 changes a traveling direction WMa of the electromagnetic wave to the traveling direction WMb along the tube axis TA, as illustrated in FIG. 2.

In one exemplary embodiment, the planar shape of each of the distribution waveguide MP1 and the dielectric window DL (the shape of each of the distribution waveguide MP1 and the dielectric window DL when viewed from the direction of the tube axis TA of the coaxial waveguide MC2) can be an approximately circular shape.

In one exemplary embodiment, the antenna device MWS includes a plurality of coaxial waveguides MC1a and a plurality of the inner conductors CB1a. The plurality of coaxial waveguides MC1a and the plurality of the inner conductors CB1a are disposed at approximately equal intervals on an imaginary line CLa when viewed from the front surface FC1 side of the dielectric window DL, as illustrated in FIG. 3. The imaginary line CLa is a circular shape centered on the tube axis TA of the coaxial waveguide MC2. In other words, the plurality of the coaxial waveguides MC1a and the plurality of the inner conductors CB1a are disposed in a concentric circular shape when viewed from the tube axis TA.

In one exemplary embodiment, the antenna device MWS includes a plurality of coaxial waveguides MC1b and a plurality of the inner conductors CB1b. The plurality of the coaxial waveguides MC1b and the plurality of the inner conductors CB1b are disposed at approximately equal intervals on an imaginary line CLb when viewed from the front surface FC1 side of the dielectric window DL, as illustrated in FIG. 3. The imaginary line CLb is a circular shape centered on the tube axis TA of the coaxial waveguide MC2 and is a concentric circle with respect to the imaginary line CLa. In other words, the plurality of the coaxial waveguides MC1b and the plurality of the inner conductors CB1b are disposed in a concentric circular shape when viewed from the tube axis TA.

The length of the diameter of the imaginary line CLb (the distance from the tube axis TA to the imaginary line CLb) is shorter than the length of the diameter of the imaginary line CLa (the distance from the tube axis TA to the imaginary line CLa). When the edge of the dielectric window DL is viewed from the tube axis TA, the coaxial waveguides MC1a and the coaxial waveguides MC1b do not overlap each other (are alternately disposed). In other words, when the edge of the dielectric window DL is viewed from the tube axis TA, one central axis TA1b is disposed approximately at the center between two central axes TA1a adjacent to each other. Further, it is preferable that at least the line connecting the tube axis TA and the central axis TA1a does not overlap the line connecting the tube axis TA and the central axis TA1b.

Figure 4:
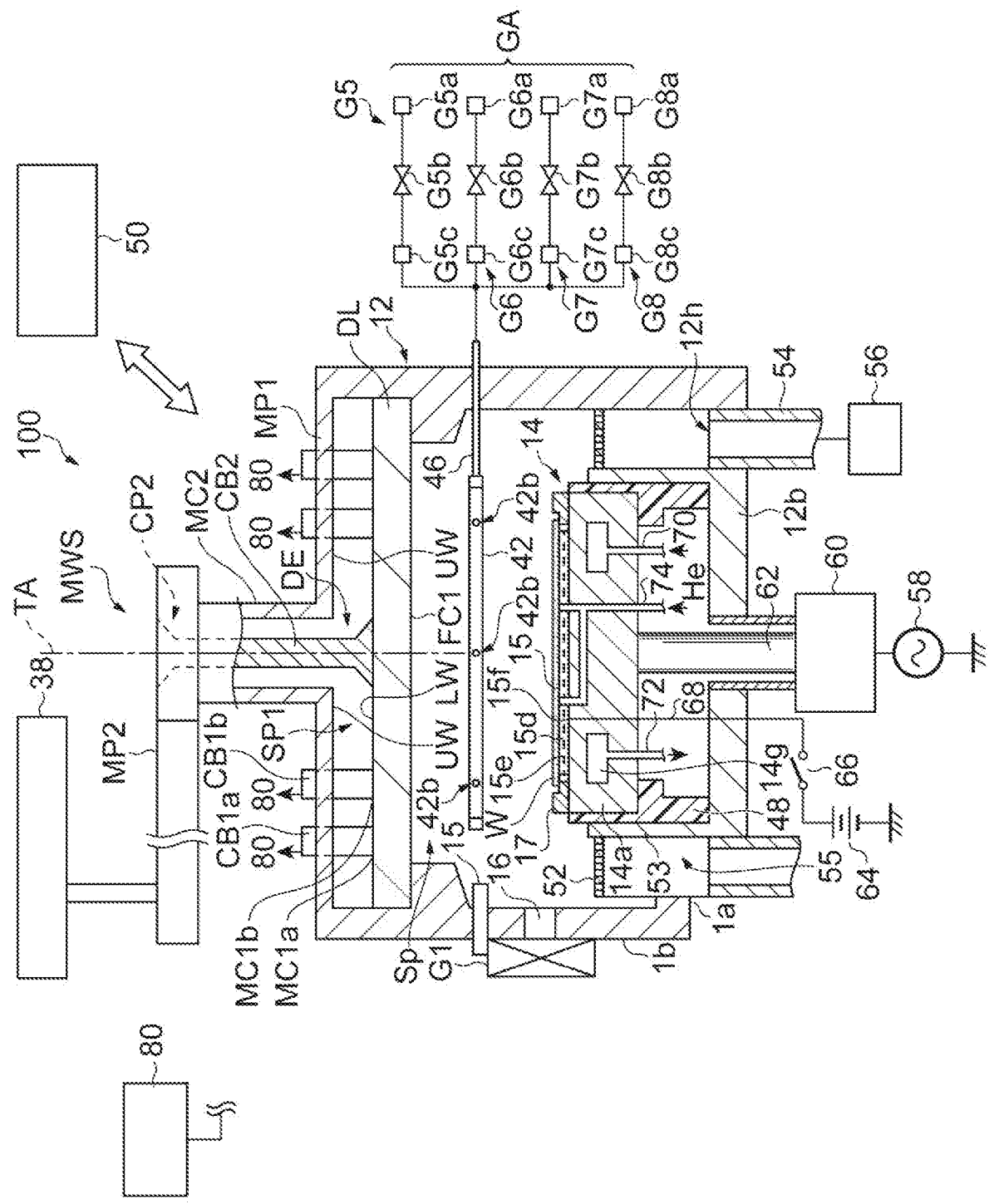
FIG. 4 is a sectional view schematically illustrating a configuration of a plasma processing apparatus in which the antenna device illustrated in FIG. 1 is used.

Next, a configuration of a plasma processing apparatus 100 which includes the antenna device MWS illustrated in FIG. 1 will be described with reference to FIG. 4.

The plasma processing apparatus 100 includes, as main configurations, a processing container 12, a gas supply system GA, an exhaust device, the electromagnetic wave generation system 38, and the antenna device MWS. The processing container 12 is configured in an airtight manner. The gas supply system GA supplies gas into the processing container 12.

The exhaust device includes an exhaust device 56 and evacuates and exhausts the inside of the processing container 12. The electromagnetic wave generation system 38 generates electromagnetic waves (microwaves). The antenna device MWS is provided at an upper portion of the processing container 12 and introduces the electromagnetic waves generated by the electromagnetic wave generation system 38 into the processing container 12.

The plasma processing apparatus 100 includes a control unit 50 which is configured to control each configuration part of the plasma processing apparatus 100 including the gas supply system GA, the exhaust device, and the antenna device MWS described above. In particular, the control unit 50 is configured to execute a method MT (a plasma processing method) illustrated in FIG. 5.

The electromagnetic wave generation system 38 generates electromagnetic waves (microwaves) of, for example, 2.45 [GHz], propagates the electromagnetic waves in the TE10 mode, and supplies the electromagnetic waves to the antenna device MWS.

The processing container 12 is a substantially cylindrical container that is grounded. The processing container 12 may be formed by a container having a square tubular shape. The processing container 12 has a bottom wall 1a and a side wall 1b having metal such as aluminum or an alloy of metal such as aluminum.

A loading and unloading port 16 and a gate valve G1 are provided in the side wall 1b of the processing container 12. The loading and unloading port 16 performs loading and unloading of a wafer W between the plasma processing apparatus 100 and a vacuum-side transport chamber (not illustrated) adjacent to the plasma processing apparatus 100. The gate valve G1 opens and closes the loading and unloading port 16.

The microwaves generated in the electromagnetic wave generation system 38 are introduced into the processing container 12 by the antenna device MWS having the configuration as described above. As the frequency of the microwaves, microwaves of, for example, 2.45 [GHz] can be used.

The processing container 12 defines a space Sp for performing plasma processing on the wafer W. The processing container 12 can include the side wall 1b and the bottom wall 1a. The side wall 1b has a substantially tubular shape extending in the direction of the tube axis TA (that is, the extending direction of the tube axis TA).

The bottom wall 1a is provided on the lower end side of the side wall 1b. An exhaust hole 12h for exhaust is provided in the bottom wall 1a. An upper end portion of the side wall 1b is open. The upper end portion opening of the side wall 1b is closed by the dielectric window DL.

The plasma processing apparatus 100 is further includes a conduit 42. The conduit 42 supplies gas from the surroundings of the tube axis TA to the space Sp between a stage 14 and the dielectric window DL. The conduit 42 annularly extends around the tube axis TA between the dielectric window DL and the stage 14.

A plurality of gas supply holes 42b are formed in the conduit 42. The plurality of the gas supply holes 42b are annularly arranged, are open toward the tube axis TA, and supply the gas supplied to the conduit 42 toward the tube axis TA. The conduit 42 is connected to a gas supply unit G5, a gas supply unit G6, a gas supply unit G7, and a gas supply unit G8 through a conduit 46.

The gas supply system GA includes the gas supply unit G5, the gas supply unit G6, the gas supply unit G7, and the gas supply unit G8. The gas supply unit G5 supplies a processing gas set in advance to the conduit 42. The gas supply unit G5 can include a gas source G5a, a valve G5b, and a flow rate controller G5c. The gas supply unit G6 supplies a processing gas set in advance to the conduit 42. The gas supply unit G6 can include a gas source G6a, a valve G6b, and a flow rate controller G6c.

The gas supply unit G7 supplies a processing gas set in advance to the conduit 42. The gas supply unit G7 can include a gas source G1a, a valve G7b, and a flow rate controller G1c. The gas supply unit G8 supplies a processing gas set in advance to the conduit 42. The gas supply unit G8 can include a gas source G8a, a valve G8b, and a flow rate controller G8c.

The stage 14 is provided to face the dielectric window DL in the direction of the tube axis TA. The stage 14 is provided such that the space Sp is interposed between the dielectric window DL and the stage 14. The wafer W is placed on the stage 14. The stage 14 can include a base 14a, an electrostatic chuck 15, and a focus ring 17.

The base 14a is supported by a tubular support part 48. The tubular support part 48 has an insulating material and extends vertically upward from the bottom wall 1a. An electrically conductive tubular support part 53 is provided on the outer periphery of the tubular support part 48. The tubular support part 53 extends vertically upward from the bottom wall 1a of the processing container 12 along the outer periphery of the tubular support part 48. An annular exhaust path 55 is formed between the tubular support part 53 and the side wall 1b.

An annular baffle plate 52 provided with a plurality of through-holes is mounted at an upper portion of the exhaust path 55. The exhaust device 56 is connected to a lower portion of the exhaust hole 12h through an exhaust pipe 54. The exhaust device 56 has a vacuum pump such as a turbo-molecular pump. The pressure in the space Sp inside the processing container 12 can be reduced to a desired degree of vacuum by the exhaust device 56.

The base 14a also serves as a high-frequency electrode. A high-frequency power source 58 for RF bias is electrically connected to the base 14a through a matching unit 60 and a power supply rod 62. The high-frequency power source 58 outputs high-frequency power having a certain frequency, for example, 13.65 [MHz], suitable for controlling the energy of ions to be drawn into the wafer W with predetermined power. The matching unit 60 accommodates a matching device for performing matching between impedance on the high-frequency power source 58 side and impedance on the load side such as mainly an electrode, plasma, and the processing container 12. A blocking capacitor for self-bias generation is included in the matching device.

The electrostatic chuck 15 that is a holding member for holding the wafer W is provided on the upper surface of the base 14a. The electrostatic chuck 15 holds the wafer W with an electrostatic attraction force. The focus ring 17 annularly surrounding the periphery of the wafer W and the periphery of the electrostatic chuck 15 is provided on the outer side in a radial direction of the electrostatic chuck 15.

The electrostatic chuck 15 includes an electrode 15d, an insulating film 15e, and an insulating film 15f. The electrode 15d is formed of a conductive film and is provided between the insulating film 15e and the insulating film 15f. A high-voltage direct-current power supply 64 is electrically connected to the electrode 15d through a switch 66 and a covered wire 68. The electrostatic chuck 15 can hold the wafer W with a Coulomb force which is generated by a direct-current voltage which is applied from the direct-current power supply 64.

An annular refrigerant chamber 14g extending in a circumferential direction is provided in the interior of the base 14a. A refrigerant having a predetermined temperature, for example, a coolant is circulated and supplied to the refrigerant chamber 14g from a chiller unit through a pipe 70 and a pipe 72. A processing temperature of the wafer W on the electrostatic chuck 15 can be controlled by the temperature of the refrigerant. In the plasma processing apparatus 100, a heat transfer gas, for example, He gas is supplied between the upper surface of the electrostatic chuck 15 and the back surface of the wafer W through a gas supply pipe 74.

Figure 5:
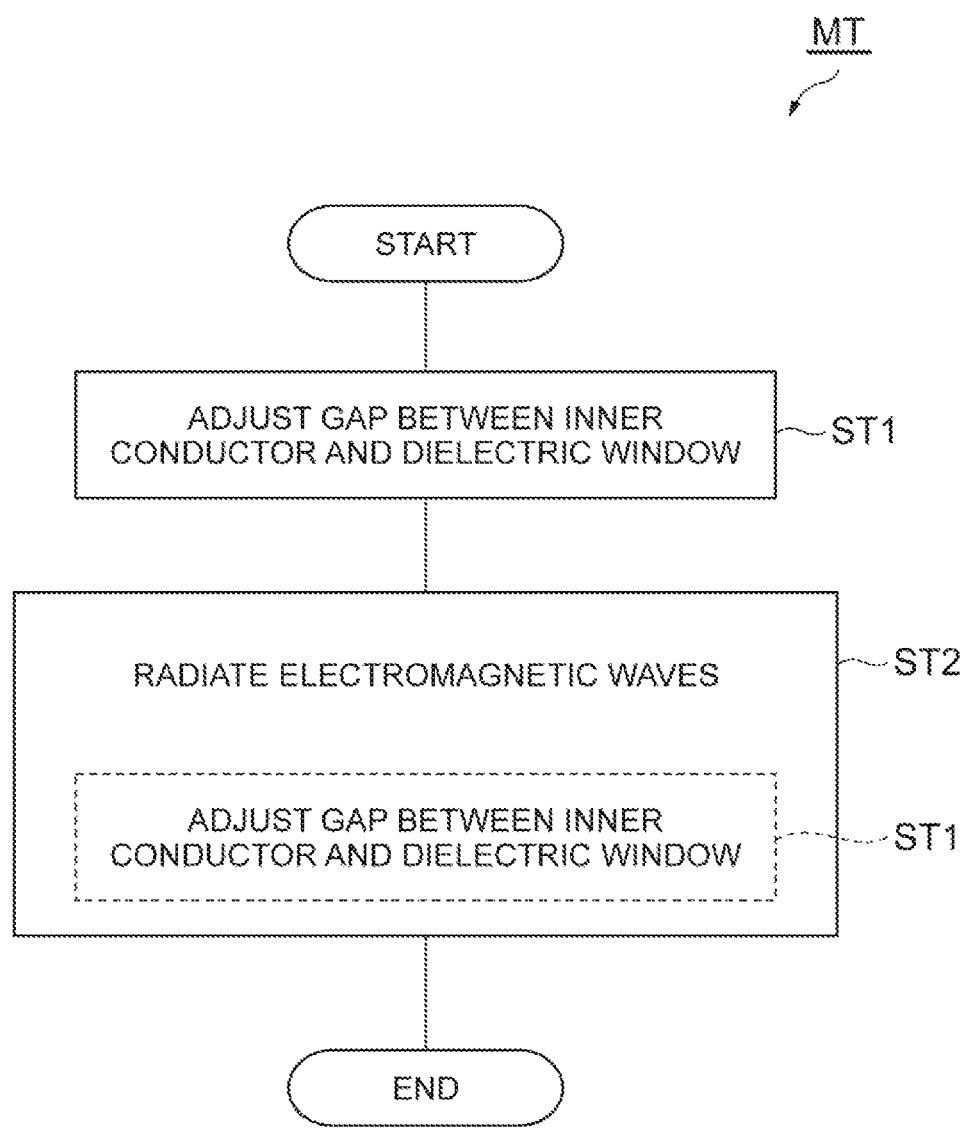
FIG. 5 is a flowchart for describing a method according to one exemplary embodiment.

A plasma processing method according to one exemplary embodiment will be described with reference to FIG. 5. The method MT illustrated in FIG. 5 uses a radiation method of electromagnetic waves, and the radiation method of electromagnetic waves includes Step ST1 (second step) and Step ST2 (first step). The method MT is executed by the plasma processing apparatus 100 illustrated in FIG. 4, in particular, by the antenna device MWS having the configuration illustrated in each of FIGS. 1 to 4 included in the plasma processing apparatus 100 (further, the antenna device MWS illustrated in each of FIGS. 8 to 13C).

In Step ST1, the gap between the inner conductor (at least one of the inner conductor CB1a and the inner conductor CB1b) and the dielectric window DL is adjusted by the drive device 80. In Step ST1, the inner conductor of which the distance from the dielectric window DL is adjusted is at least one of the inner conductor CB1a and the inner conductor CB1b. In Step ST1, the inner conductor of which the distance from the dielectric window DL is not adjusted may be provided in the antenna device MWS but not connected to the drive device 80, or may be connected to the drive device 80, or may be not provided in the antenna device MWS.

A case in which adjusting the distance from the dielectric window DL is performed for only the inner conductor CB1a in Step ST1 is assumed. In this case, the drive device 80 is configured to drive each of the plurality of the inner conductors CB1a in the direction of the tube axis TA in a synchronization manner, or is configured to drive each of the plurality of the inner conductors CB1a in the direction of the tube axis TA in an independent manner.

A case in which adjusting the distance from the dielectric window DL is performed for only the inner conductor CB1b in Step ST1 is assumed. In this case, the drive device 80 is configured to drive each of the plurality of the inner conductors CB1b in the direction of the tube axis TA in a synchronization manner, or is configured to drive each of the plurality of the inner conductors CB1b in the direction of the tube axis TA in an independent manner.

In Step ST2, the propagation of the electromagnetic waves that are transmitted to the distribution waveguide MP1 is directed toward the dielectric window DL provided on the lower wall LW of the distribution waveguide MP1 by the inner conductor provided in the distribution waveguide MP1, and the electromagnetic waves are radiated from the dielectric window DL.

Step ST1 is executed before the execution of Step ST2 or during the execution of Step ST2. In the method MT illustrated in FIG. 5, Step ST1 is executed first, and then Step ST2 is executed, but the method is not limited thereto. For example, Step ST2 is executed after Step ST1 is executed, and Step ST1 can be executed again during the execution of Step ST2. Alternatively, Step ST1 is not executed before Step ST2 is executed, and Step ST1 can be executed only during the execution of Step ST2.

Figure 6:
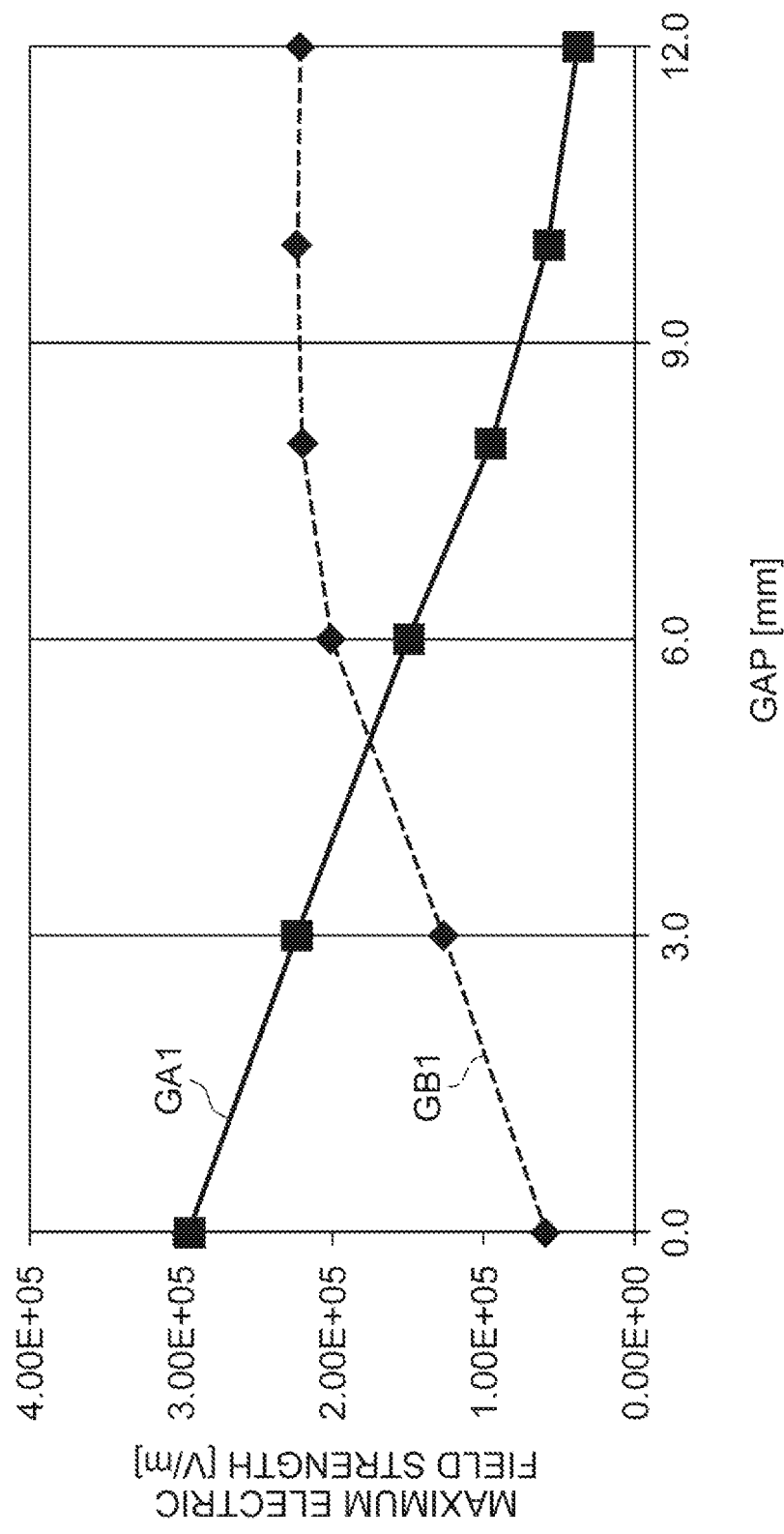
FIG. 6 is a graph for describing an effect of the antenna device according to one exemplary embodiment.

An aspect of adjusting the electric field strength of the electromagnetic waves by the antenna device MWS will be described with reference to FIG. 6. The results illustrated in FIG. 6 are results obtained when the antenna device MWS includes the inner conductor CB1a and the inner conductor CB1b and the drive device 80 drives only the plurality of the inner conductors CB1a in a synchronization manner. In this case, in the inner conductor CB1b, the end EG2b is in contact with the upper wall UW of the distribution waveguide MP1 and the end EG1b is in contact with the dielectric window DL through the opening end EDb of the coaxial waveguide MC1b.

In FIG. 6, the horizontal axis represents a gap [mm] between the inner conductor CB1a and the dielectric window DL (distance between the end EG1a of the inner conductor CB1a and the opening end EDa of the coaxial waveguide MC1a), and the vertical axis represents the maximum electric field strength [V/m] at the electric discharge area DCEa and the electric discharge area DCEb. In FIG. 6, a curved line GA1 represents a change of the maximum electric field strength [V/m] at the electric discharge area DCEa according to the gap [mm] between the inner conductor CB1a and the dielectric window DL. In FIG. 6, a curved line GB1 represents a change of the maximum electric field strength [V/m] at the electric discharge area DCEb according to the gap [mm] between the inner conductor CB1a and the dielectric window DL.

As illustrated in FIG. 6, as the gap between the inner conductor CB1a and the dielectric window DL is increased, the maximum electric field strength at the electric discharge area DCEa directly below the inner conductor CB1a is reduced (the curved line GA1), and inversely, the maximum electric field strength at the electric discharge area DCEb directly below the inner conductor CB1b is increased (the curved line GB1).

Figure 7:
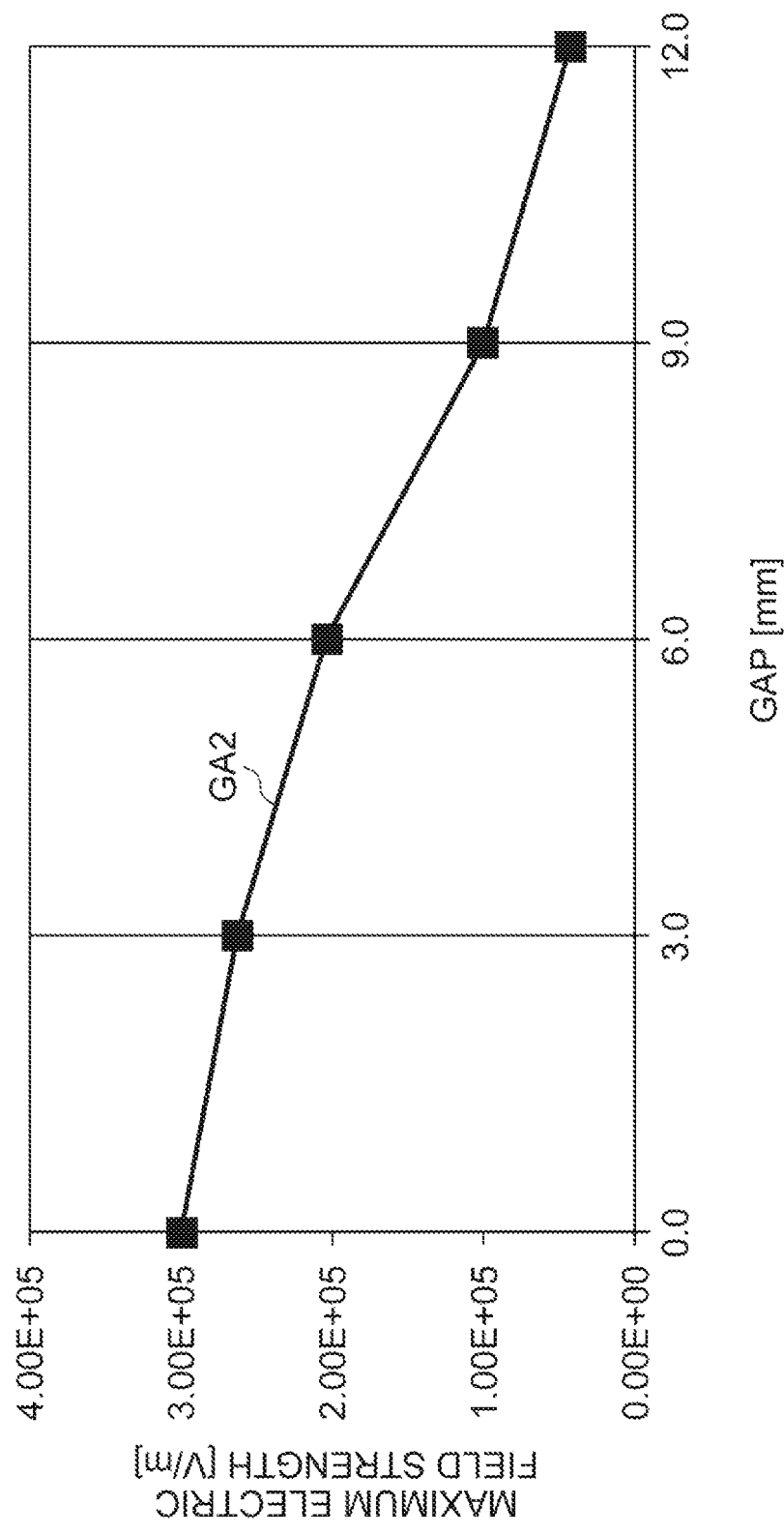
FIG. 7 is a graph for describing an effect of the antenna device according to one exemplary embodiment.

Further, another aspect of adjusting the electric field strength of the electromagnetic waves by the antenna device MWS will be described with reference to FIG. 7. The results illustrated in FIG. 7 are results obtained when the antenna device MWS includes only the inner conductor CB1a and the drive device 80 drives only the plurality of the inner conductors CB1a in a synchronization manner. In this case, the antenna device MWS does not include the inner conductor CB1b, the coaxial waveguide MC1b, and the slide contact SCb.

In FIG. 7, the horizontal axis represents a gap [mm] between the inner conductor CB1a and the dielectric window DL (distance between the end EG1a of the inner conductor CB1a and the opening end EDa of the coaxial waveguide MC1a), and the vertical axis represents the maximum electric field strength [V/m] at the electric discharge area DCEa. In FIG. 7, a curved line GA2 represents a change of the maximum electric field strength [V/m] at the electric discharge area DCEa according to the gap [mm] between the inner conductor CB1a and the dielectric window DL.

As illustrated in FIG. 7, as the gap between the inner conductor CB1a and the dielectric window DL is increased, the maximum electric field strength at the electric discharge area DCEa directly below the inner conductor CB1a is reduced (the curved line GA2).

As described above, the electric field strength by the electromagnetic waves radiated from the inner conductor CB1a can be adjusted by driving the inner conductor CB1a in the direction of the tube axis TA. In addition, there may be a case in which the inner conductor CB1*b* is driven by the drive device 80 together with the inner conductor CB1*a*. In this case, the electric field strength by the electromagnetic waves radiated from the inner conductor CB1*a* and the electric field strength by the electromagnetic waves radiated from the inner conductor CB1*b* can be adjusted by driving each of the inner conductor CB1*a* and the inner conductor CB1*b* in the direction of the tube axis TA. In addition, there may be a case in which the inner conductor CB is included but only the inner conductor CB1*a* is connected to the drive device 80. In this case, the electric field strength by the electromagnetic waves radiated from the inner conductor CB1*a* can be adjusted by driving the inner conductor CB1*a* in the direction of the tube axis TA. The electromagnetic waves radiated from the inner conductor CB1*b* can also be varied by the driving of the inner conductor CB1*a*. Further, by adjusting the gap between the dielectric window DL and the inner conductor such as the inner conductor CB1*a* and the inner conductor CB1*b*, the electric field strength by the electromagnetic waves radiated from such inner conductors can be adjusted. Thus, according to the present disclosure, the distribution of the plasma density can be flexibly changed according to process conditions.

The electromagnetic waves can be locally radiated from the flat front surface FC1 of the dielectric window DL to the electric discharge area DCEa, the electric discharge area DCEb, or the like. The electromagnetic waves can be radiated from the front surface FC1 through the dispersion part DE, the coaxial conversion part CP1*a*, the coaxial conversion part CP1*b*, the inner conductor CB1*a*, and the inner conductor CB1*b*.

Further, the first inner conductor and the second inner conductor are disposed such that the distances thereof from the tube axis are different from each other. Therefore, even in a case where a sudden transition occurs in the impedance of either the first inner conductor or the second inner conductor, the radiation of the electromagnetic waves from the tube axis side becomes possible.

The distance LKa from the opening end EDa to the upper wall UW is a value of an odd multiple of the reference length. Therefore, electromagnetic waves having relatively high intensity can be radiated from the opening end EDa.

The distance LKb from the opening end EDb to the upper wall UW is a value of an odd multiple of the reference length. Therefore, electromagnetic waves can be radiated from the opening end EDb.

The distance LKa is not shorter than the distance LKb (is equal to or larger than the distance LKb). In particular, in the case of LKa>LKb, the opening end EDa is closer to the front surface FC1 of the dielectric window DL than the opening end EDb. Therefore, the electromagnetic wave which is radiated from the opening end EDa has higher intensity than the electromagnetic wave which is radiated from the opening end EDb. In this case, the plasma which is generated in the electric discharge area DCEa of the electromagnetic wave which is radiated from the opening end EDa is higher in density than the plasma which is generated in the electric discharge area DCEb of the electromagnetic wave which is radiated from the opening end EDb.

Further, since the inner conductor CB2 is disposed on the tube axis TA in the coaxial waveguide MC2, the electromagnetic waves can be favorably guided in the coaxial waveguide MC2.

Second Exemplary Embodiment

Figure 8:
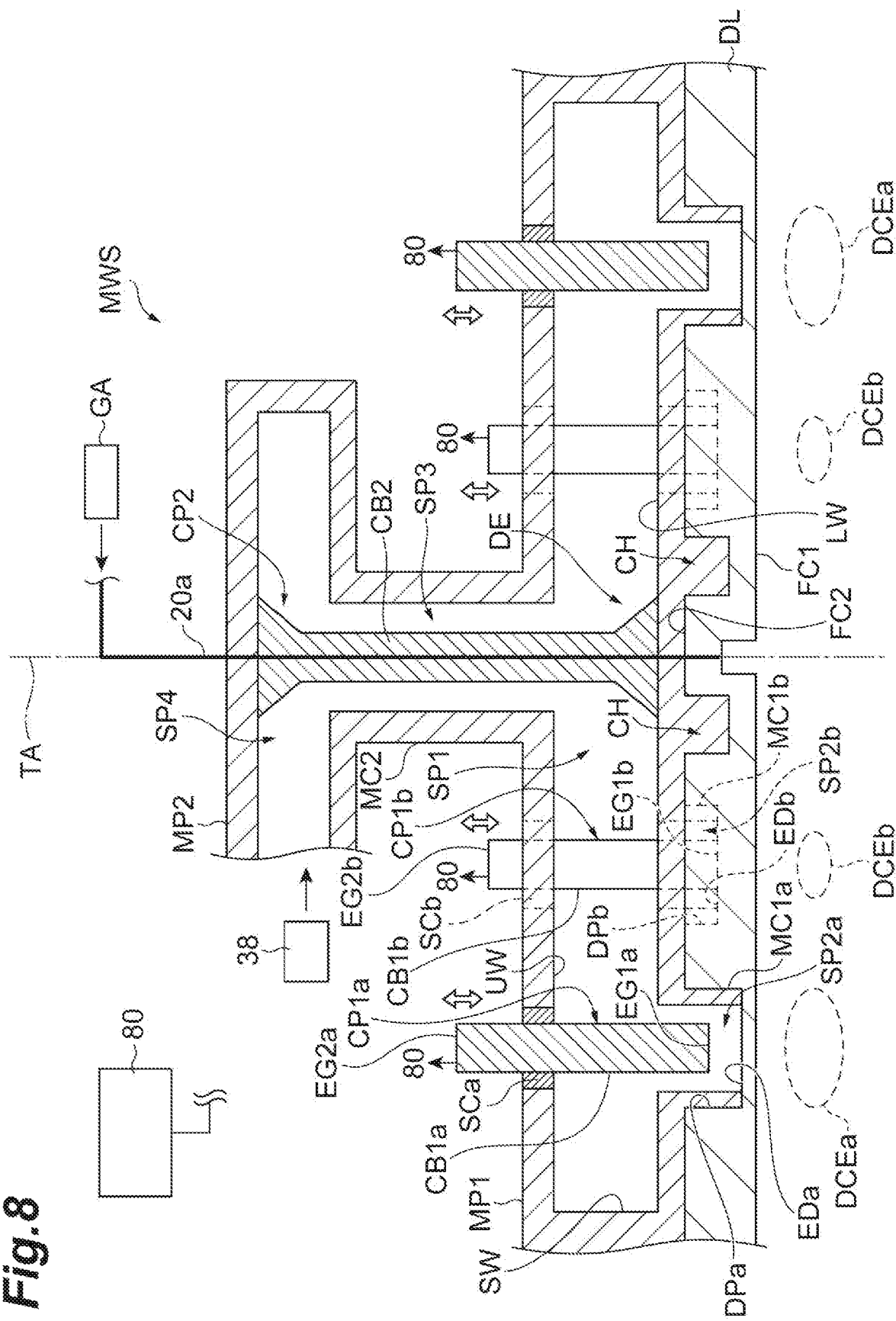
FIG. 8 is a sectional view schematically illustrating another configuration of the antenna device according to one exemplary embodiment.

Another configuration of the antenna device MWS according to one exemplary embodiment will be described with reference to FIG. 8. FIG. 8 is a sectional view schematically illustrating another configuration of the antenna device MWS according to one exemplary embodiment.

The antenna device MWS illustrated in FIG. 8 has a configuration in which a gas line 20*a* and a choke structure CH are added to the antenna device MWS illustrated in FIG. 1. The gas line 20*a* which is connected to the external gas supply system GA is provided in the interior of the inner conductor CB2. The gas line 20*a* penetrates the inner conductor CB2 and the dielectric window DL and communicates with the space Sp on the front surface FC1.

The gas line 20*a* penetrates the inner conductor CB2 from the coaxial conversion part CP2 to reach the dielectric window DL and further penetrates the dielectric window DL to reach the front surface FC1 of the dielectric window DL. The gas which is supplied from the gas supply system GA can be supplied from the front surface FC1 of the dielectric window DL into the space Sp through the gas line 20*a*. Further, the choke structure CH is provided in the dielectric window DL.

The choke structure CH is disposed to surround the dispersion part DE when viewed from the front surface FC1 of the dielectric window DL. The choke structure CH is provided on the back surface FC2 of the dielectric window DL, is a portion recessed in the back surface FC2 when viewed from above the back surface FC2, and is fitted to the lower wall LW.

In this manner, in the second exemplary embodiment, due to the gas line 20*a*, it becomes possible to supply a gas suitably from the front surface FC1 of the dielectric window DL into the space Sp on the front surface FC1.

Third Exemplary Embodiment

Figure 9:
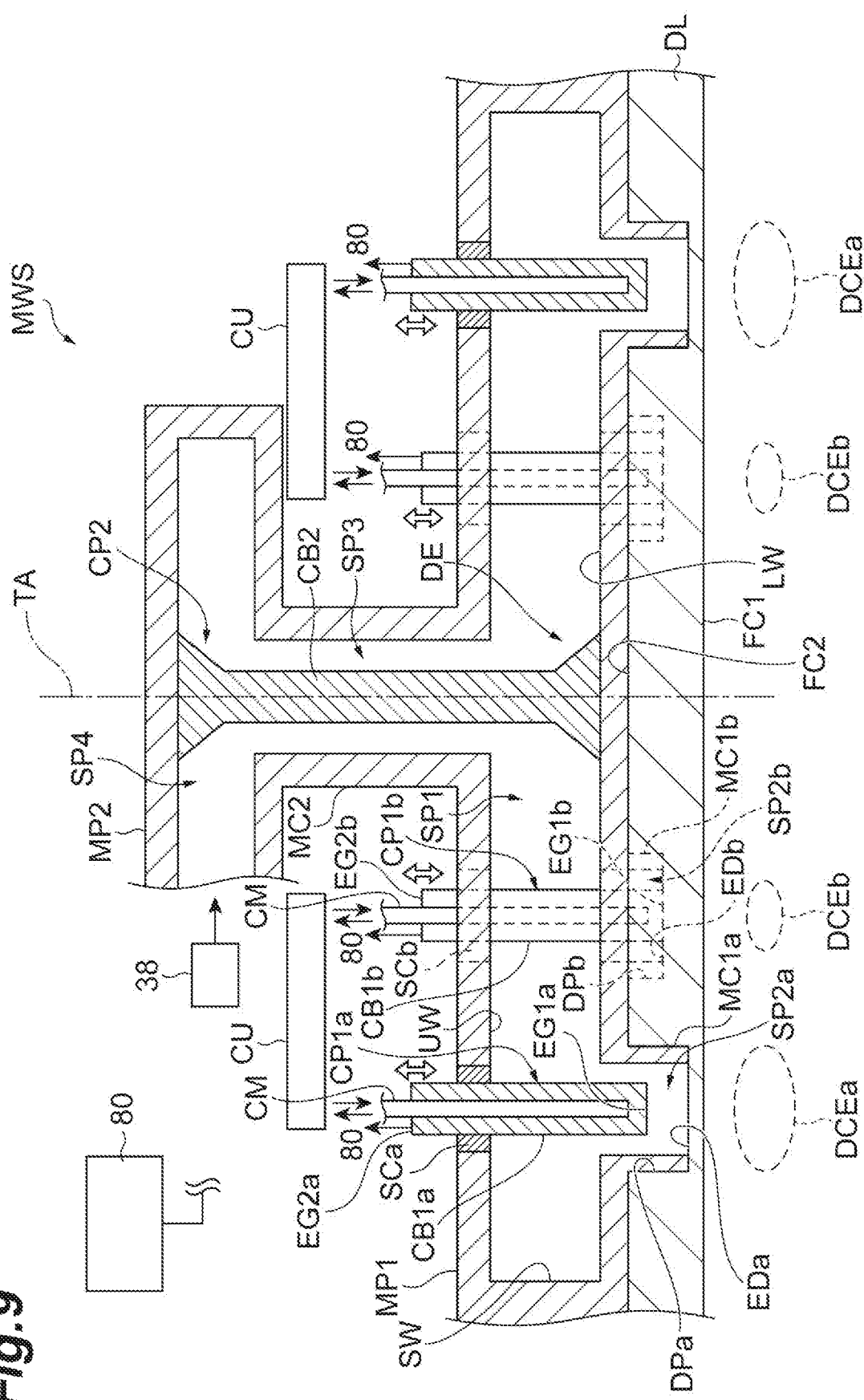
FIG. 9 is a sectional view schematically illustrating another configuration of the antenna device according to one exemplary embodiment.

Another configuration of the antenna device MWS according to one exemplary embodiment will be described with reference to FIG. 9. FIG. 9 is a sectional view schematically illustrating another configuration of the antenna device MWS according to one exemplary embodiment.

The antenna device MWS illustrated in FIG. 9 has a configuration in which a refrigerant tube CM is added to the antenna device MWS illustrated in FIG. 1. The refrigerant tubes CM which are connected to an external chiller unit CU are provided in the interior of the inner conductor CB1*a* and the interior of the inner conductor CB1*b*.

In this manner, in the third exemplary embodiment, the inner conductor CB1*a* which includes the coaxial conversion part CP1*a*, and the inner conductor CB1*b* which includes the coaxial conversion part CP can be cooled to a suitable temperature by a refrigerant. The refrigerant is supplied (circulated) from the chiller unit CU to the inner conductor CB1*a* and the inner conductor CB1*b* through the refrigerant tubes CM.

When the electromagnetic waves are propagated to the inner conductor CB1*a* and the coaxial conversion part CP1*a* and when the electromagnetic waves are propagated to the inner conductor CB1*b* and the coaxial conversion part CP1*b*, there may be a case where the inner conductor CB1*a*, the coaxial conversion part CP1*a*, the inner conductor CB1*b*, and the coaxial conversion part CP1*b* are heated.

Even in such a case, it becomes possible to keep the temperatures of the inner conductor CB1*a*, the coaxial conversion part CP1*a*, the inner conductor CB1*b*, and the coaxial conversion part CP1*b* constant. For this reason, the conversion of the traveling direction of the electromagnetic wave in each of the coaxial conversion part CP1*a* and the coaxial conversion part CP1*b*, and the wave guide of the electromagnetic wave along each of the inner conductor CB1*a* and the inner conductor CB1*b* can be stably and favorably realized.

Fourth Exemplary Embodiment

Figure 10:
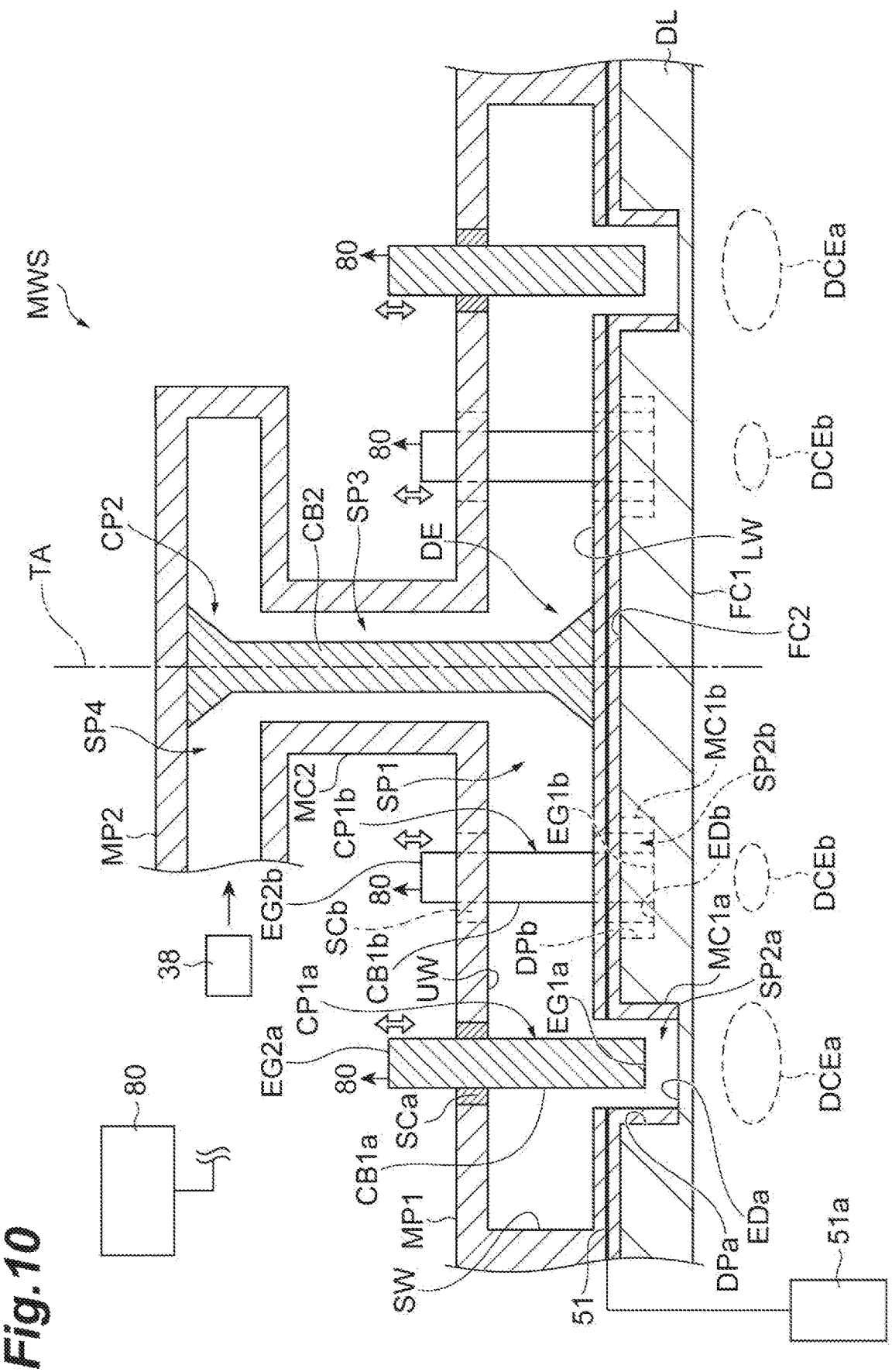
FIG. 10 is a sectional view schematically illustrating another configuration of the antenna device according to one exemplary embodiment.

Another configuration of the antenna device MWS according to one exemplary embodiment will be described with reference to FIG. 10. FIG. 10 is a sectional view schematically illustrating another configuration of the antenna device MWS according to one exemplary embodiment.

The antenna device MWS illustrated in FIG. 10 has a configuration in which a heater 51 is added to the antenna device MWS illustrated in FIG. 1. The heater 51 which is connected to an external heater power supply 51*a* is provided in the interior of the lower wall LW.

In this manner, in the fourth exemplary embodiment, due to the heater 51, it is possible to raise the temperature of each waveguide such as the distribution waveguide MP1 and the temperature of the dielectric window DL to a suitable temperature. If plasma is generated, the temperature of the dielectric window DL and the temperature of each waveguide such as the distribution waveguide MP1 rise due to heat input from the plasma. However, it is possible to perform heating in advance by the heater 51. For this reason, since a temperature change of each waveguide before the plasma generation and during the plasma generation can be reduced, the wave guide of the electromagnetic waves in each waveguide such as the distribution waveguide MP1 is favorably performed, and thus stable plasma can be generated.

The heater 51 may be provided in the interior of the lower wall LW, as illustrated in FIG. 10. However, there is no limitation, and the heater 51 may be provided between the lower wall LW and the dielectric window DL.

Fifth Exemplary Embodiment

Figure 11:
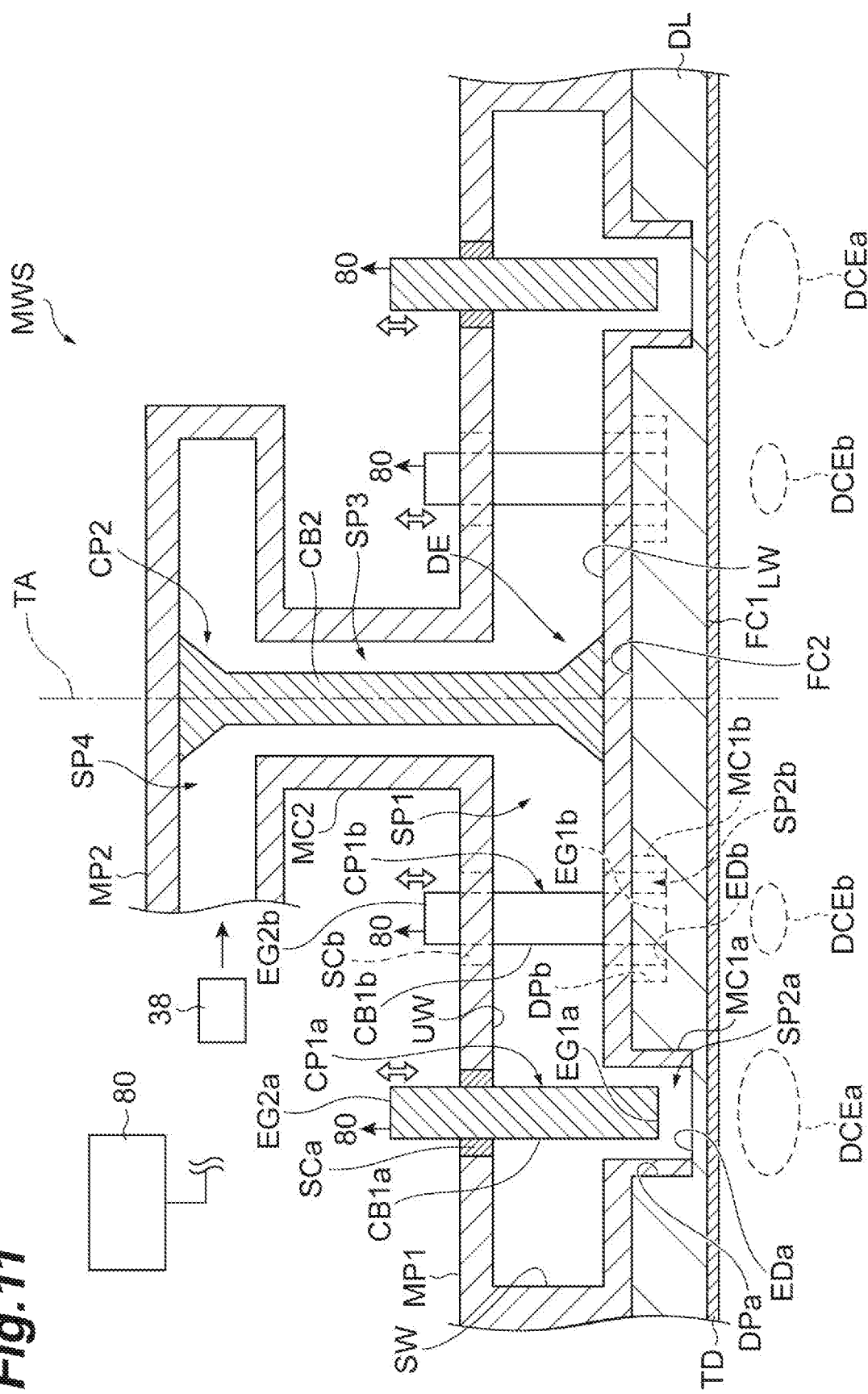
FIG. 11 is a sectional view schematically illustrating another configuration of the antenna device according to one exemplary embodiment.

Another configuration of the antenna device MWS according to one exemplary embodiment will be described with reference to FIG. 11. FIG. 11 is a sectional view schematically illustrating another configuration of the antenna device MWS according to one exemplary embodiment.

The antenna device MWS illustrated in FIG. 11 has a configuration in which a protective film TD is added to the antenna device MWS illustrated in FIG. 1. The protective film TD is provided on the flat front surface FC1 of the dielectric window DL. A material of the protective film TD is a material having plasma resistance and can be, for example, $Y_2O_3$, $YF_3$, Si, $SiO_2$, or SIC.

In this manner, in the fifth exemplary embodiment, since the protective film TD is provided on the flat front surface FC1, the protective film TD can be conformally and easily formed with a uniform film thickness over the front surface FC1.

Sixth Exemplary Embodiment

Figure 12:
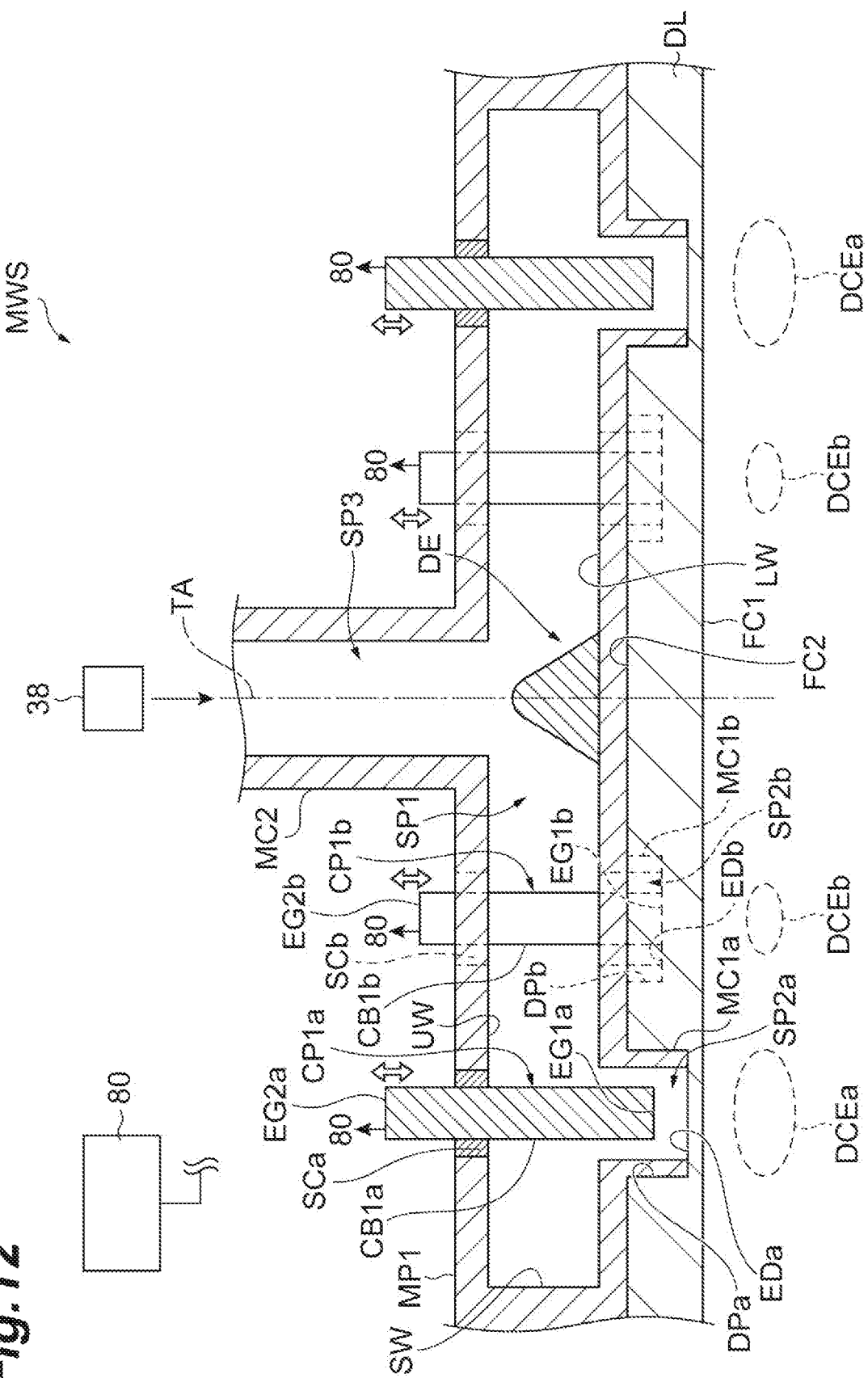
FIG. 12 is a sectional view schematically illustrating another configuration of the antenna device according to one exemplary embodiment.

Another configuration of the antenna device MWS according to one exemplary embodiment will be described with reference to FIG. 12. FIG. 12 is a sectional view schematically illustrating another configuration of the antenna device MWS according to one exemplary embodiment.

The antenna device MWS illustrated in FIG. 12 has a configuration in which the inner conductor CB2 (including the coaxial conversion part CP2) and the introduction waveguide MP2 are not provided in the antenna device MWS illustrated in FIG. 1. The inner conductor CB2 is not disposed in the intra-tube space SP3 of the coaxial waveguide MC2. A dispersion part DE having a conical (or truncated conical) shape or the like is disposed on the lower wall LW and on the tube axis TA of the coaxial waveguide MC2 in the intra-tube space SP1 of the distribution waveguide MP1.

In this manner, in the sixth exemplary embodiment, the inner conductor CB2 and the introduction waveguide MP2 are not used. Therefore, the shape and structure of the antenna device MWS can be further simplified, so that the antenna device MWS can be easily manufactured and easily mounted to the plasma processing apparatus 100.

The respective configurations of the first to sixth exemplary embodiments described above can be variously combined with each other as much as possible. For example, it is possible to add any one or all of the configurations of the second to fifth exemplary embodiments to the configuration of the first exemplary embodiment. Further, in a case where the configuration of the sixth exemplary embodiment is used in place of the configuration of the first exemplary embodiment, it is possible to further add any one or all of the configurations of the second to fifth exemplary embodiments thereto.

Figure 13A:
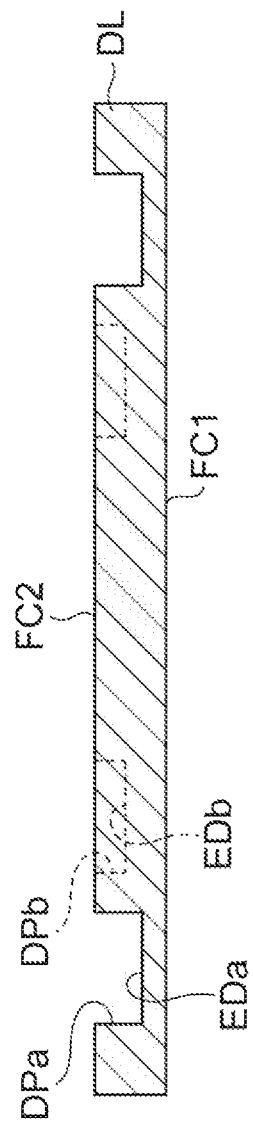
FIG. 13A is a view illustrating a variation of a shape of a front surface of the dielectric window, and illustrates a cross section of the dielectric window.
Figure 13B:
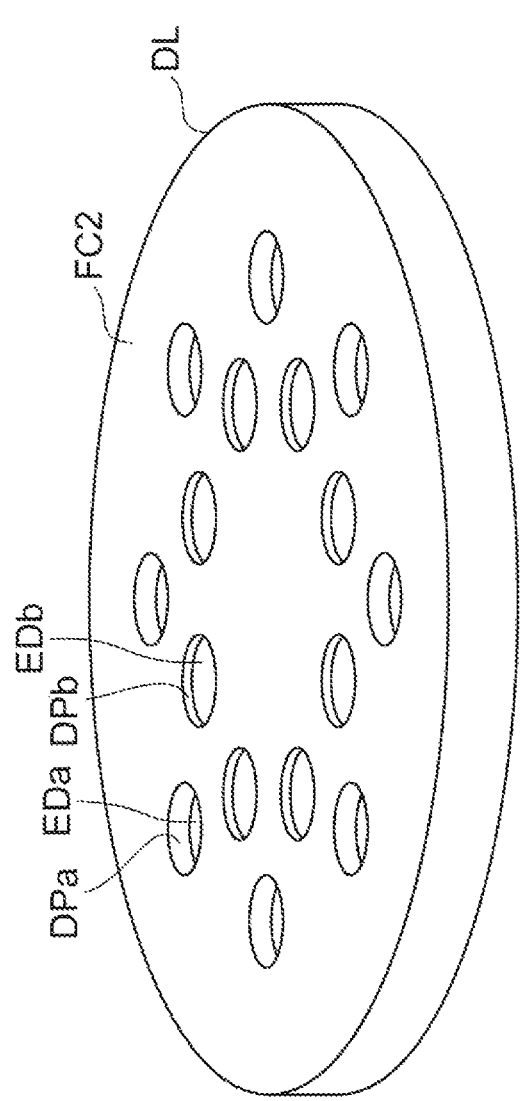
FIG. 13B is a view illustrating the variation of the shape of the front surface of the dielectric window, and illustrates the dielectric window as viewed from a back surface side.
Figure 13C:
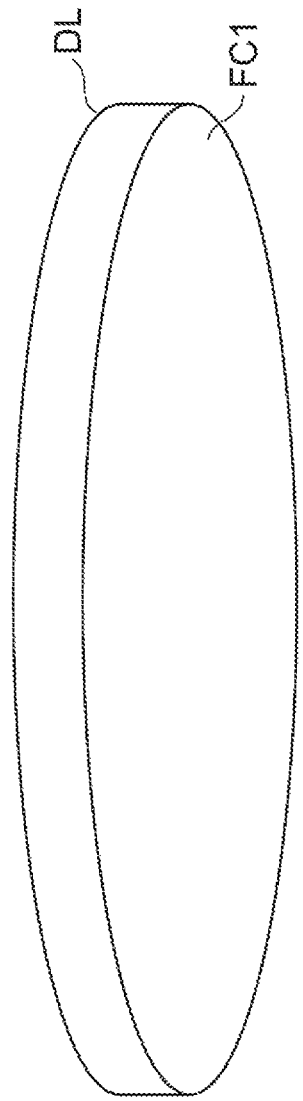
FIG. 13C is a view illustrating the variation of the shape of the front surface of the dielectric window, and illustrates the dielectric window as viewed from the front surface side.

In the first to sixth exemplary embodiments, the dielectric window DL having the flat front surface FC1 is used. Accordingly, it becomes easy to perform coating on the front surface FC1 of the dielectric window DL, such as forming a coating film such as the protective film TD on the front surface FC1 of the dielectric window DL. However, as long as it is a shape in which coating becomes easy, there is no limitation to the above-described shape in which the front surface FC1 of the dielectric window DL is flat. Further, the front surface FC1 having such a flat shape is illustrated in FIGS. 13A to 13C. However, any shape may be used as long as it is a shape having no irregularities, and for example, the front surface FC1 having the shape illustrated in each of FIGS. 14A to 17C can be used.

Figure 14A:
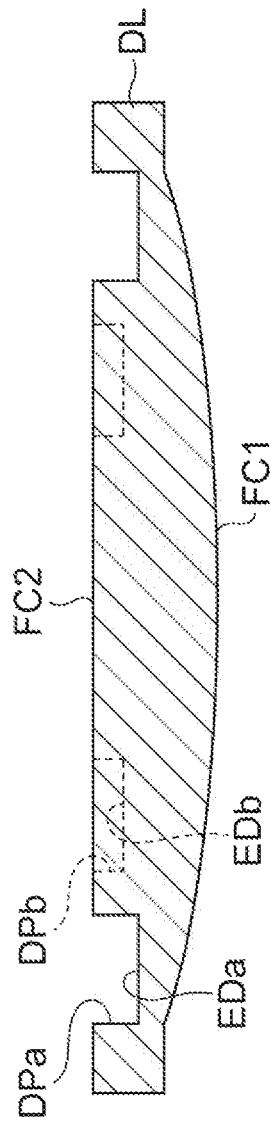
FIG. 14A is a view illustrating a variation of a shape of a front surface of the dielectric window, and illustrates a cross section of the dielectric window.
Figure 14B:
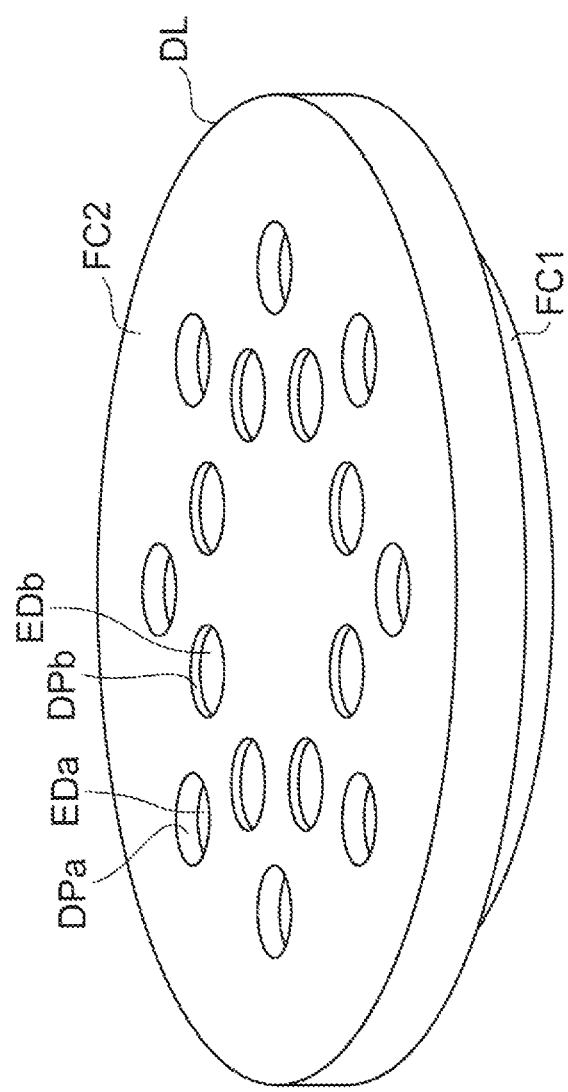
FIG. 14B is a view illustrating the variation of the shape of the front surface of the dielectric window, and illustrates the dielectric window as viewed from a back surface side.
Figure 14C:
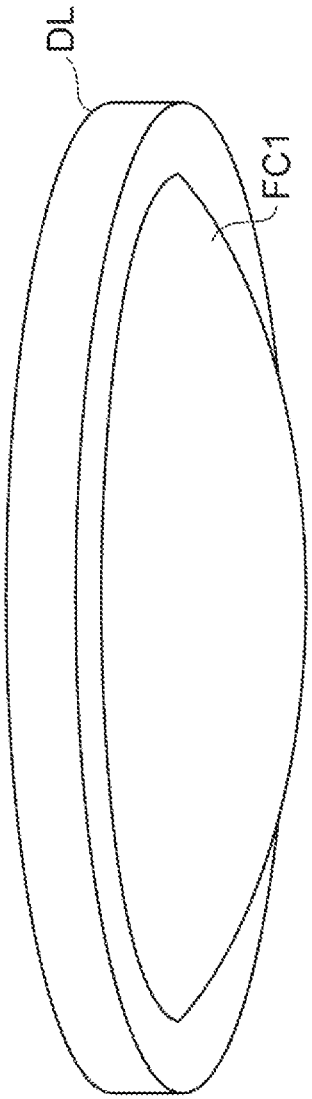
FIG. 14C is a view illustrating the variation of the shape of the front surface of the dielectric window, and illustrates the dielectric window as viewed from the front surface side.

The shape of the front surface FC1 illustrated in each of FIGS. 14A to 14C is an example of the shape having no irregularities and is a curved surface shape protruding in a direction away from the back surface FC2 of the dielectric window DL.

Figure 15A:
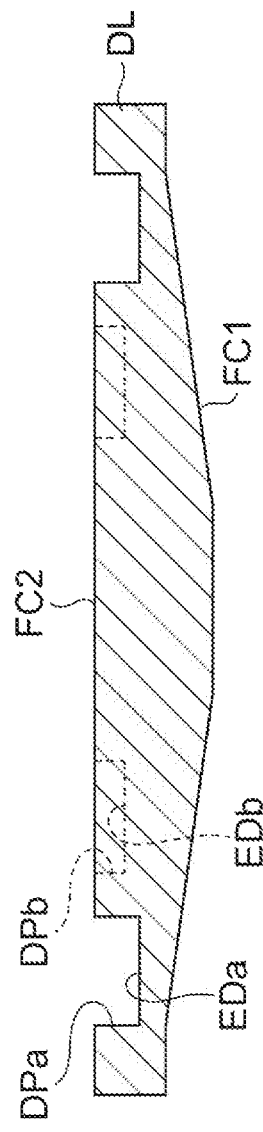
FIG. 15A is a view illustrating a variation of a shape of a front surface of the dielectric window, and illustrates a cross section of the dielectric window.
Figure 15B:
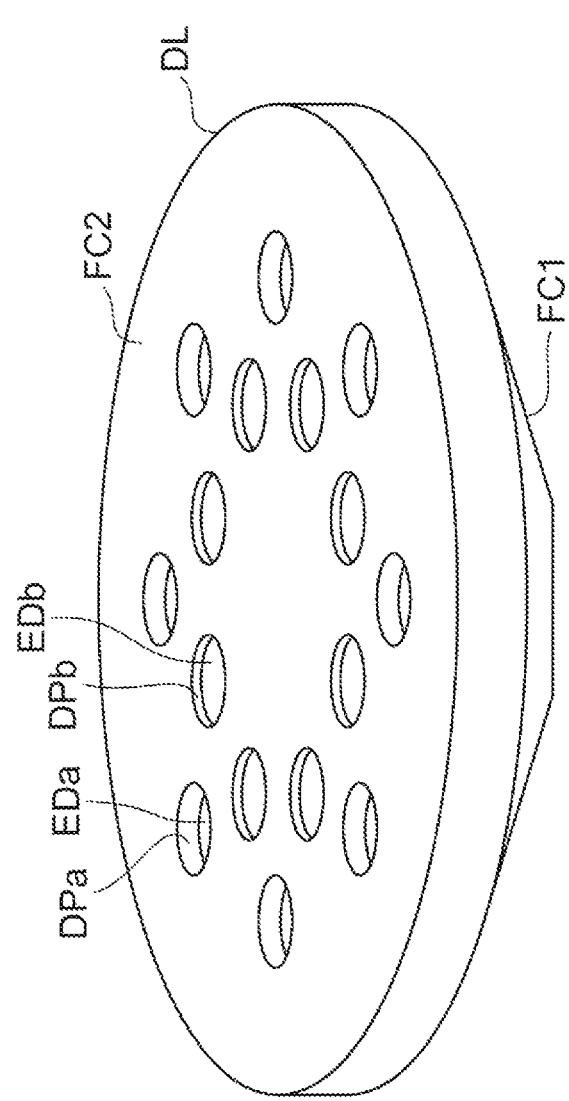
FIG. 15B is a view illustrating the variation of the shape of the front surface of the dielectric window, and illustrates the dielectric window as viewed from a back surface side.
Figure 15C:
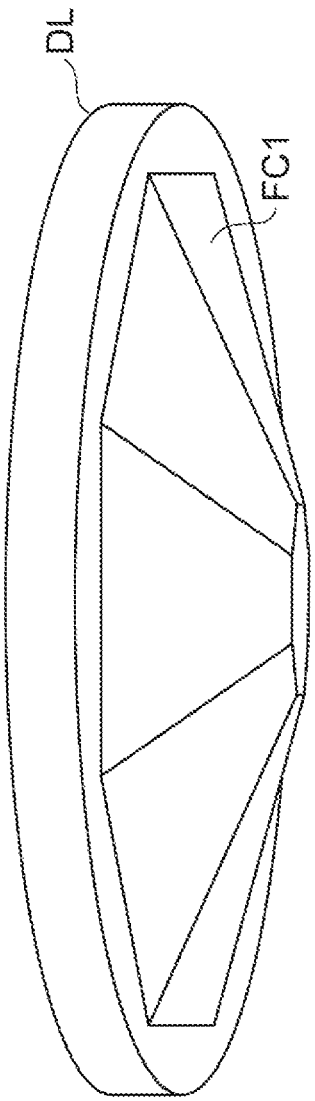
FIG. 15C is a view illustrating the variation of the shape of the front surface of the dielectric window, and illustrates the dielectric window as viewed from the front surface side.

The shape of the front surface FC1 illustrated in each of FIGS. 15A to 15C is an example of the shape having no irregularities, and it can be said that it is a tapered shape protruding in the direction away from the back surface FC2 of the dielectric window DL. The protruding portion of the front surface FC1 is configured by joining a plurality of quadrangles extending from a base end of the protruding portion toward the apex.

Figure 16A:
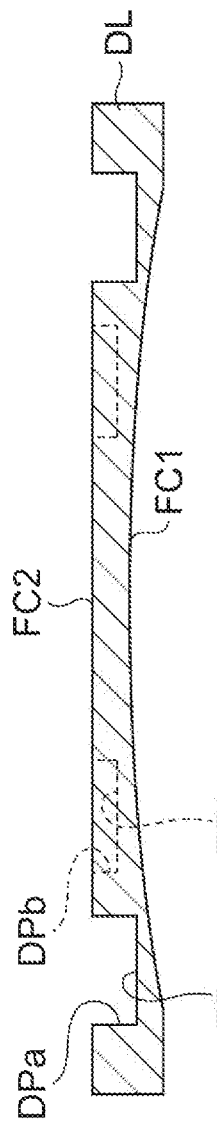
FIG. 16A is a view illustrating a variation of a shape of a front surface of the dielectric window, and illustrates a cross section of the dielectric window.
Figure 16B:
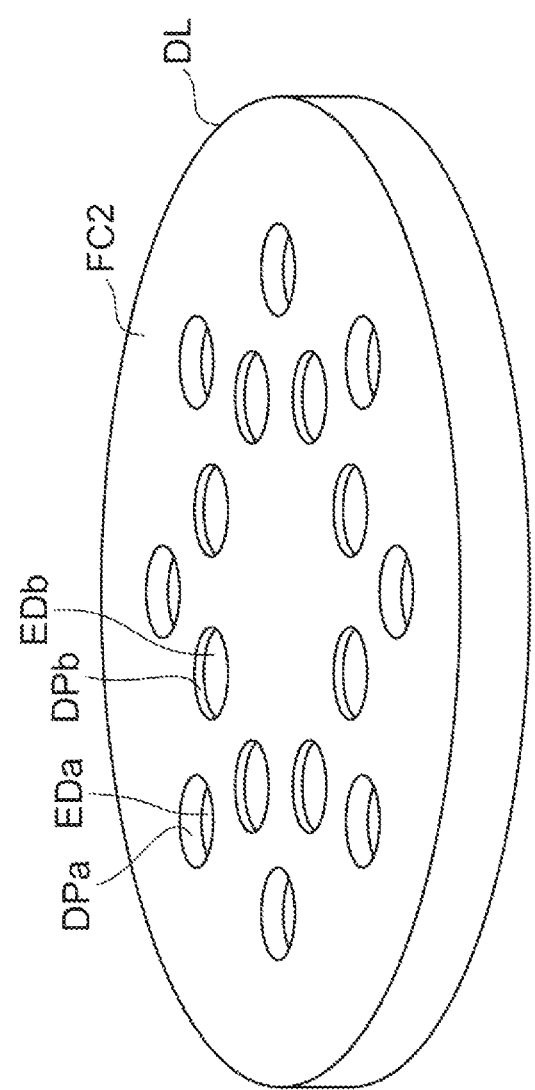
FIG. 16B is a view illustrating the variation of the shape of the front surface of the dielectric window, and illustrates the dielectric window as viewed from a back surface side.
Figure 16C:
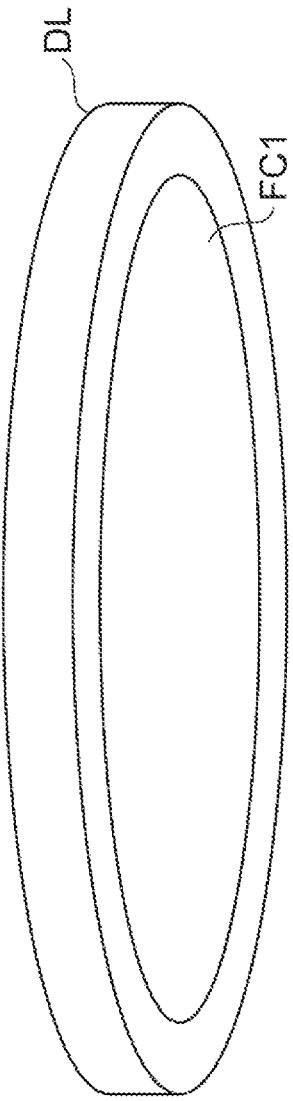
FIG. 16C is a view illustrating the variation of the shape of the front surface of the dielectric window, and illustrates the dielectric window as viewed from the front surface side.

The shape of the front surface FC1 illustrated in each of FIGS. 16A to 16C is an example of the shape having no irregularities and is a curved surface shape recessed in a direction toward the back surface FC2 of the dielectric window DL.

Figure 17A:
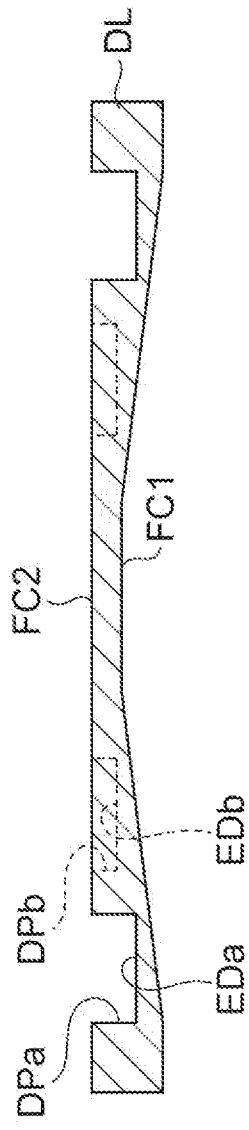
FIG. 17A is a view illustrating a variation of a shape of a front surface of the dielectric window, and illustrates a cross section of the dielectric window.
Figure 17B:
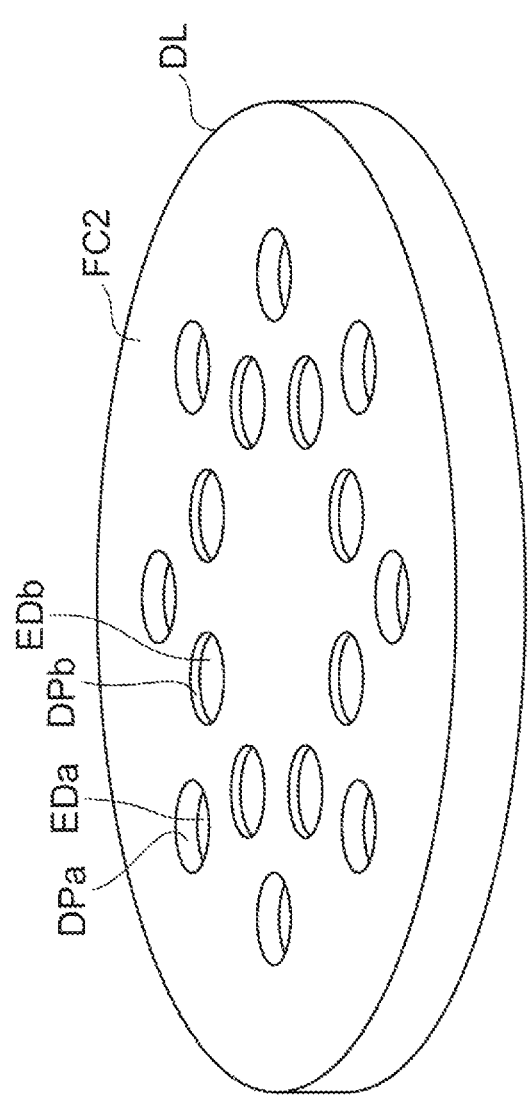
FIG. 17B is a view illustrating the variation of the shape of the front surface of the dielectric window, and illustrates the dielectric window as viewed from a back surface side.
Figure 17C:
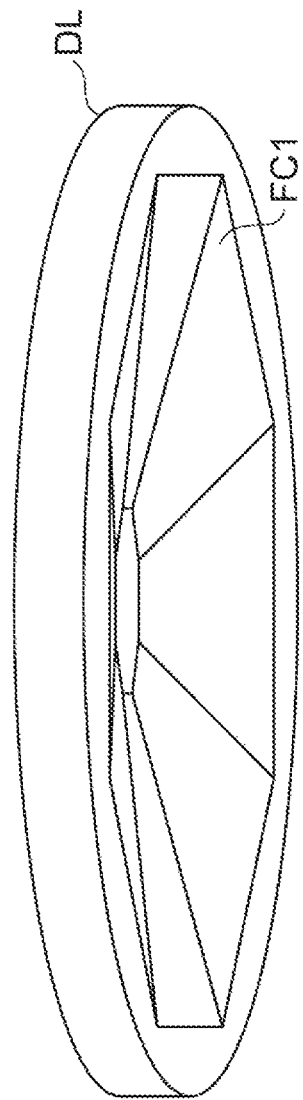
FIG. 17C is a view illustrating the variation of the shape of the front surface of the dielectric window, and illustrates the dielectric window as viewed from the front surface side.

The shape of the front surface FC1 illustrated in each of FIGS. 17A to 17C is an example of the shape having no irregularities and is a shape recessed in the direction toward the back surface FC2 of the dielectric window DL. The recessed portion of the front surface FC1 is configured by joining a plurality of the quadrangles extending toward the deepest bottom portion of the recessed portion.

In any of the above-described various variations of the shape of the front surface FC1, irregularities are not provided in the portion facing the opening end EDa of the coaxial waveguide MC1a, of the front surface FC1, and the portion facing the opening end EDb of the coaxial waveguide MC1b, of the front surface FC1. The shape of the front surface FC1 can be various shapes in which irregularities are not provided.

Figure 19:
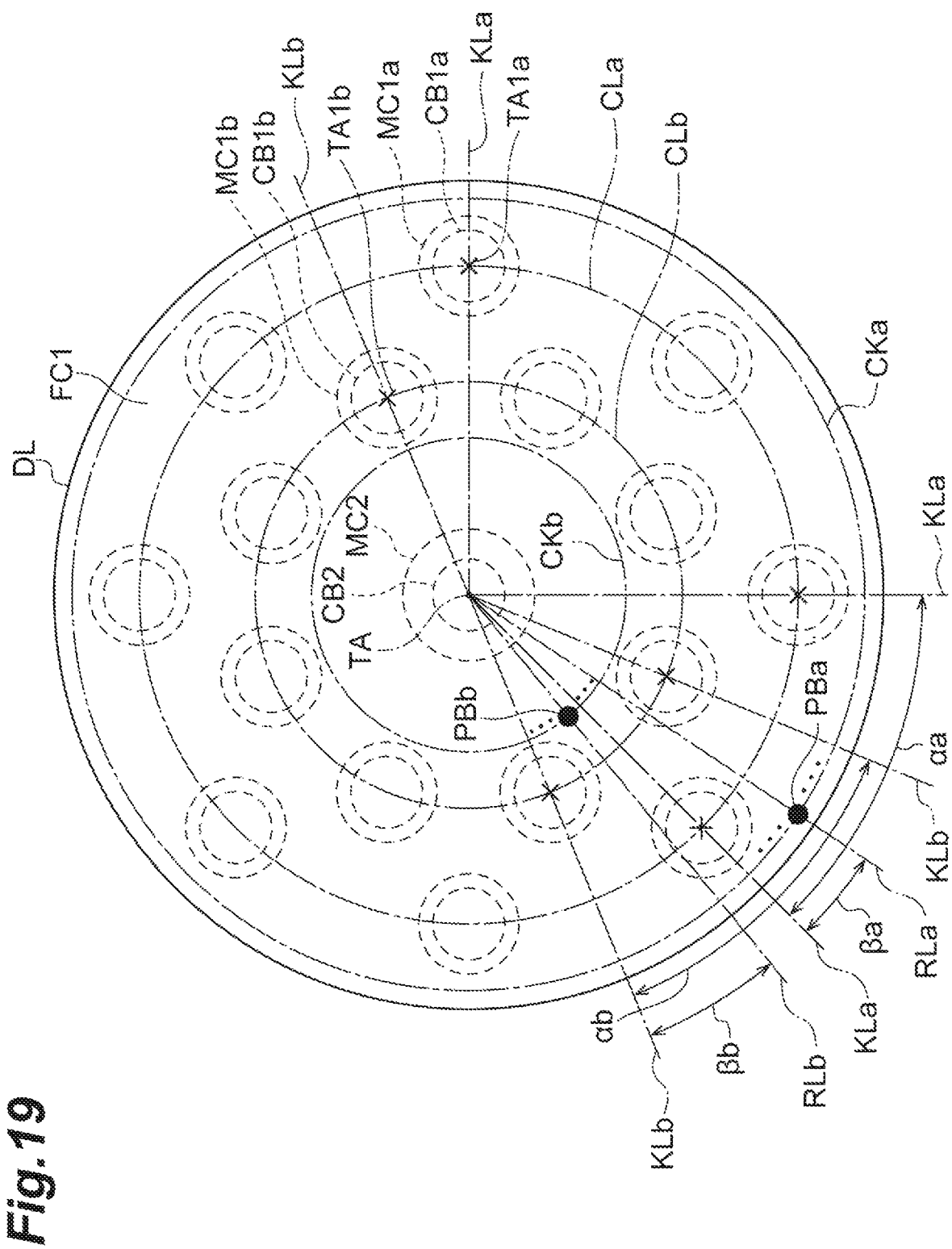
FIG. 19 is a view illustrating positions of a plurality of probes illustrated in FIG. 18.
Figure 20:
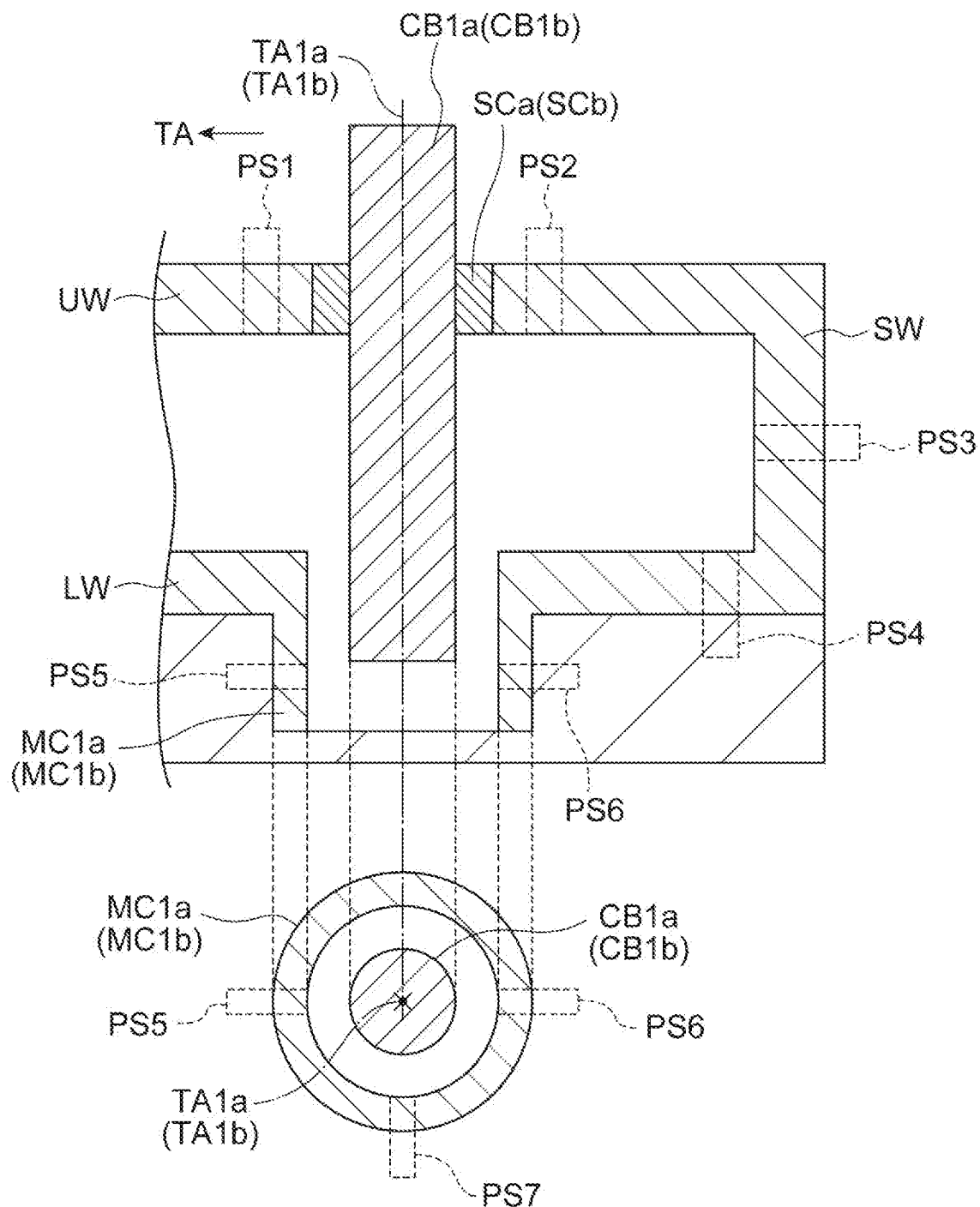
FIG. 20 is a view illustrating positions of the plurality of probes illustrated in FIG. 18.

Any of all the antenna device MWS according to the exemplary embodiments described above can further include all or a part of the configurations illustrated in FIGS. 18 to 20.

As illustrated in FIG. 18, the antenna device MWS includes a probe group PBGa, a detection device DTa, and an arithmetic device CT. The antenna device MWS can further include a probe group PBGb and a detection device DTb.

The antenna device MWS has a configuration including both the probe group PBGa and the probe group PBGb, and the probe group PBGa and the probe group PBGb are used together. The antenna device MWS may have a configuration including only the probe group PBGa, and only the probe group PBGa may be used. The antenna device MWS may have a configuration including only the probe group PBGb, and only the probe group PBGb may be used.

The probe group PBGa includes a plurality of probes PBa which are electric conductors. The probe group PBGa is provided in the distribution waveguide MP1 or the coaxial waveguide MC1a. The probe group PBGa is used to detect a physical quantity (hereinafter, referred to as a physical quantity PV) that is used for plasma generation and is present around the distribution waveguide MP1 or the coaxial waveguide MC1a.

The probe group PBGb includes a plurality of probes PBb which are electric conductors. The probe group PBGb is provided in the distribution waveguide MP1 or the coaxial waveguide MC1b. The probe group PBGb is used to detect the physical quantity PV that is used for plasma generation and is present around the distribution waveguide MP1 or the coaxial waveguide MC1b.

The physical quantity PV is used for plasma generation, and is distributed and present around the distribution waveguide MP1, the coaxial waveguide MC1a, and the coaxial waveguide MC1b at the time of the plasma generation.

In the present disclosure, the physical quantity PV is a physical quantity detected by the probe group PBGa and the probe group PBGb, and may be, for example, electric field strength, potential, and power.

Both the plurality of the probes PBa and the plurality of the probes PBb are disposed in a concentric circular shape when viewed from the tube axis TA. More specifically, the plurality of the probes PBa are disposed at roughly equal intervals (periodically) on an imaginary line CKa. The imaginary line CKa is a circular shape centered on the tube axis TA when viewed from the tube axis TA. The plurality of the probes PBb are disposed at roughly equal intervals (periodically) on an imaginary line CKb. The imaginary line CKb is a circular shape centered on the tube axis TA when viewed from the tube axis TA.

Both the imaginary line CKa and the imaginary line CKb are concentric circles centered on the tube axis TA when viewed from the tube axis TA. The imaginary line CKb is closer to the tube axis TA than the imaginary line CKa.

In FIG. 19, an example of disposition of the probe group PBGa and the probe group PBGb when viewed from the tube axis TA is illustrated, and a line KLa, a line KLb, a line RLa, a line RLb, an angle αa, an angle αb, an angle βa, and an angle βb are illustrated.

The line KLa is a line connecting the tube axis TA and the central axis TA1a of the inner conductor CB1a when viewed from the tube axis TA. The line KLb is a line connecting the tube axis TA and the central axis TA1b of the inner conductor CB1b when viewed from the tube axis TA.

The line RLa is a line connecting the tube axis TA and the probe PBa when viewed from the tube axis TA. The line RLb is a line connecting the tube axis TA and the probe PBb when viewed from the tube axis TA.

The angle αa is an angle (acute angle) between two lines KLa each passing the central axis TA1a of each of two adjacent inner conductors CB1a when viewed from the tube axis TA. The angle αb is an angle (acute angle) between two lines KLb each passing the central axis TA1b of each of two adjacent inner conductors CB1b when viewed from the tube axis TA.

The angle βa is an angle (acute angle) between the line KLa passing the central axis TA1a of one inner conductor CB1a and the line RLa passing the probe PBa at a position closest to the corresponding inner conductor CB1a when viewed from the tube axis TA. The angle βb is an angle (acute angle) between the line KLb passing the central axis TA1b of one inner conductor CB1b and the line RLb passing the probe PBb at a position closest to the corresponding inner conductor CB1b when viewed from the tube axis TA.

In FIG. 20, when viewed from a section including the line KLa or the line KLB and the tube axis TA, a plurality of positions where the probe PBa or the probe PBb can be disposed are illustrated. The probe PBa can be disposed at any of positions PS1 to PS7. The probe PBb can be disposed at any of positions PS1, PS2, and PS4 to PS7.

The position PS1 and the position PS2 are in the upper wall UW, and are in the vicinity of the inner conductor CB1a (in case of the probe PBa) or the inner conductor CB1b (in case of the probe PBb). The position PS1 is close to the tube axis TA. The position PS2 is close to the side wall SW.

The position PS3 is in the side wall SW. The position PS4 is in the lower wall LW.

The position PS5, the position PS6, and the position PS7 are in the coaxial waveguide MC1a (in case of the probe PBa) or the coaxial waveguide MC1b (in case of the probe PBb). The position PS5 is close to the tube axis TA. The position PS6 is close to the side wall SW. The position PS7 is present between the position PS5 and the position PS6 (for example, at an intermediate point in the circumferential direction) in the circumferential direction of the coaxial waveguide MC1a (in case of the probe PBa) or the coaxial waveguide MC1b (in case of the probe PBb) when viewed from above the tube axis TA.

Although not illustrated, the positions at which the probe PBa and the probe PBb are disposed in the upper wall UW are not limited to the position PS1 and the position PS2. For example, the probe PBa and the probe PBb can be disposed in the upper wall UW to correspond to the positional relationship between the position PS5, the position PS6, and the position PS7. That is, the probe PBa or the probe PBb can be disposed between the position PS1 and the position PS2 (for example, at an intermediate point in the circumferential direction) in the circumferential direction of the coaxial waveguide MC1a (in case of the probe PBa) or the coaxial waveguide MC1b (in case of the probe PBb).

Although not illustrated, the positions at which the probe PBa and the probe PBb are disposed in the lower wall LW are not limited to the position PS4. The position at which the probe PBa is disposed in the lower wall LW may be any position close to the tube axis TA or close to the side wall SW, in the vicinity of the inner conductor CB1a, or may be any position in the circumferential direction of the coaxial waveguide MC1a. The position at which the probe PBb is disposed in the lower wall LW may be any position close to the tube axis TA or close to the side wall SW, in the vicinity of the inner conductor CB1b, or may be any position in the circumferential direction of the coaxial waveguide MC1b.

Although not illustrated, in the direction of the tube axis TA, the position PS3 in the side wall SW is not limited.

Returning to FIG. 18, the description is made. Each of a plurality of coaxial cables CBa is connected to each of the plurality of the probes PBa of the probe group PBGa. Each of the plurality of the coaxial cables CBa is connected to each of a plurality of detection devices DTa. Each of the plurality of the probes PBa is connected to each of the plurality of the detection devices DTa through each of the plurality of the coaxial cables CBa. The plurality of the detection devices DTa are connected to the arithmetic device CT.

The detection device DTa detects a signal output from the probe PBa connected to the detection device DTa, and transmits the detected signal to the arithmetic device CT. A plurality of signals output from the plurality of the probes PBa represent the physical quantities PV around the distribution waveguide MP1 or the coaxial waveguide MC1a detected by the probe group PBGa. The detection device DTa may include a detector and an oscilloscope connected to the detector.

Each of a plurality of coaxial cables CBb is connected to each of the plurality of the probes PBb of the probe group PBGb. Each of the plurality of the coaxial cables CBb is connected to each of a plurality of detection devices DTb. Each of the plurality of the probes PBb is connected to each of the plurality of the detection devices DTb through each of the plurality of the coaxial cables CBb. The plurality of the detection devices DTb are connected to the arithmetic device CT.

The detection device DTb detects a signal output from the probe PBb connected to the detection device DTb, and transmits the detected signal to the arithmetic device CT. A plurality of signals output from the plurality of the probes PBb represent the physical quantities PV around the distribution waveguide MP1 or the coaxial waveguide MC1b detected by the probe group PBGb. The detection device DTb may include a detector and an oscilloscope connected to the detector.

The arithmetic device CT includes a CPU, a RAM, a ROM, and the like, and is configured to analyze a plurality of signals transmitted from the plurality of the detection devices DTa and the plurality of the detection devices DTb by the CPU executing a computer program, for example. More specifically, the arithmetic device CT is configured to acquire a distribution of the physical quantities PV around the distribution waveguide MP1 or the coaxial waveguide MC1a on the basis of a plurality of values of the physical quantities PV detected by the probe group PBGa. The arithmetic device CT is configured to control the drive device 80 that drives the inner conductor CB1a and the inner conductor CB1b, on the basis of the acquired distribution of the physical quantities PV around the distribution waveguide MP1 or the coaxial waveguide MC1a.

The arithmetic device CT is configured to acquire a distribution of the physical quantities PV around the distribution waveguide MP1 or the coaxial waveguide MC1b on the basis of a plurality of values of the physical quantities PV detected by the probe group PBGb. The arithmetic device CT is configured to control the drive device 80 on the basis of the acquired distribution of the physical quantities PV around the distribution waveguide MP1 or the coaxial waveguide MC1b.

In one exemplary embodiment, the plasma processing apparatus 100 has a configuration in which the arithmetic device CT is included in the control unit 50, but is not limited thereto, and may have a configuration in which the arithmetic device CT and the control unit 50 are provided separately.

In FIG. 21, an example of values of the physical quantities PV detected by the plurality of the probes PBa is illustrated in a distribution REa, and an example of values of the physical quantities PV detected by the plurality of the probes PBb is illustrated in a distribution REb.

The horizontal axis of the distribution REa represents the position of the probe PBa [°] (a position on the imaginary line CKa when viewed from the tube axis TA in FIG. 19; an angle between two adjacent lines RLa). In FIG. 21, a case in which the number of coaxial waveguides MC1a is the same as the number of probes PBa, the coaxial waveguides MC1a are disposed at substantially equal intervals on the imaginary line CLa when viewed from the tube axis TA, and the probes PBa are disposed at substantially equal intervals on the imaginary line CKa when viewed from the tube axis TA is exemplified. In this case, the angle between the two adjacent lines RLa can be the same as the angle $\alpha a$ between the two adjacent lines KLa.

The horizontal axis of the distribution REb represents the position of the probe PBb (a position on the imaginary line CKb when viewed from the tube axis TA in FIG. 19; an angle between two adjacent lines RLb). In FIG. 21, a case in which the number of coaxial waveguides MC1b is the same as the number of probes PBb, the coaxial waveguides MC1b are disposed at substantially equal intervals on the imaginary line CLb when viewed from the tube axis TA, and the probes PBb are disposed at substantially equal intervals on the imaginary line CKb when viewed from the tube axis TA is exemplified. In this case, the angle between the two adjacent lines RLb can be the same as the angle $\alpha b$ between the two adjacent lines KLb.

In FIG. 21, the vertical axis of each of the distribution REa and the distribution REb represents the physical quantity PV.

Each of a plurality of points PTa illustrated in the distribution REa represents the value of the physical quantity PV detected by each of the plurality of the probes PBa. A line ALa represents an average value (Ave) of the values of the physical quantities PV detected by each of the plurality of the probes PBa.

Each of a plurality of points PTb illustrated in the distribution REb represents the value of the physical quantity PV detected by each of the plurality of the probes PBb. A line ALb represents an average value (Ave) of the values of the physical quantities PV detected by each of the plurality of the probes PBb.

$\sigma$ is the standard deviation of the values of the physical quantities PV detected by each of the plurality of the probes PBa (in case of the distribution REa), and is the standard deviation of the values of the physical quantities PV detected by each of the plurality of the probes PBb (in case of the distribution REb). $3\sigma$ is three times $\sigma$. In FIG. 21, $3\sigma$ is illustrated as an example, but there is no limitation, and $\sigma$, $2\sigma$ (two times $\sigma$), and the like may be used.

A case in which, in the distribution REa detected by the probe group PBGa, the arithmetic device CT detects the physical quantities PV (points PTa illustrated in FIG. 21) outside a range of the average value (Av)±three times the standard deviation (3σ) (equal to or greater than Ave−3σ and equal to or less than Ave+3σ) is considered. In this case, the arithmetic device CT controls the drive device 80 such that all of the physical quantities PV detected by the probe group PBGa are within the range equal to or greater than Ave−3σ and equal to or less than Ave+3σ by driving the inner conductor CB1*a*. In this manner, plasma can be generated at a relatively uniform density in a portion below the front surface FC1 of the dielectric window DL particularly along the imaginary line CKa.

A case in which, in the distribution REb detected by the probe group PBGb, the arithmetic device CT detects the physical quantities PV (points PTb illustrated in FIG. 21) outside a range of the average value (Av)±three times the standard deviation (3σ) (equal to or greater than Ave−3σ and equal to or less than Ave+3σ) is considered. In this case, the arithmetic device CT controls the drive device 80 such that all of the physical quantities PV detected by the probe group PBGb are within the range equal to or greater than Ave−3σ and equal to or less than Ave+3σ by driving the inner conductor CB1*b*. In this manner, plasma can be generated at a relatively uniform density in a portion below the front surface FC1 of the dielectric window DL particularly along the imaginary line CKb.

The arithmetic device CT can be configured to control the drive device 80 such that the average value represented by the line ALa in the distribution REa and the average value represented by the line ALb in the distribution REb are aligned to a specific value (for example, a value obtained by averaging the two average values). In this case, plasma can be generated at a relatively uniform density over the approximately entire portion below the front surface FC1 of the dielectric window DL.

The arithmetic device CT can be configured to acquire the standard deviation and the average value of the values of all the physical quantities PV detected by the probe group PBGa and the probe group PBGb, and to control the drive device 80 on the basis of the average value and the standard deviation. Also in this case, plasma can be generated at a relatively uniform density over the approximately entire portion below the front surface FC1 of the dielectric window DL.

According to one exemplary embodiment, electric field strength by electromagnetic waves radiated in the plasma processing apparatus can be flexibly adjusted.

Various exemplary embodiments have been described above. However, there is no limitation to the exemplary embodiments described above, and various omissions, substitutions, and changes may be made. Further, it is possible to combine elements in different exemplary embodiments to form other exemplary embodiments.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An antenna device configured to radiate electromagnetic waves, the antenna device comprising:
   a first waveguide;
   a second waveguide;
   a third waveguide;
   a dielectric window;
   a first inner conductor; and
   a drive device,
   wherein the second waveguide is connected to an upper wall of the first waveguide and communicates with the first waveguide,
   the dielectric window is in contact with a lower wall of the first waveguide,
   the first waveguide is provided between the dielectric window and the second waveguide, and extends in a direction crossing a tube axis of the second waveguide,
   the first inner conductor penetrates the upper wall, is electrically connected with the upper wall, and extends along a direction of the tube axis from an inside of the first waveguide to an inside of the third waveguide,
   a first end of the first inner conductor is positioned at a center of the third waveguide, in a surface crossing the tube axis,
   the third waveguide is connected to the lower wall on the dielectric window side and communicates with the first waveguide,
   a first opening end of the third waveguide is connected to the dielectric window, and
   the drive device is connected to the first inner conductor, and is configured to drive the first inner conductor in the direction of the tube axis.

2. The antenna device according to claim 1, wherein the drive device is configured to change a gap between the first end of the first inner conductor and the dielectric window by driving the first inner conductor in the direction of the tube axis.

3. The antenna device according to claim 1,
   wherein a plurality of the third waveguides and a plurality of the first inner conductors are provided, and
   the plurality of the third waveguides and the plurality of the first inner conductors are disposed in a concentric circular shape when viewed from the tube axis.

4. The antenna device according to claim 3, wherein the drive device is configured to drive each of the plurality of the first inner conductors in the direction of the tube axis in a synchronization manner.

5. The antenna device according to claim 3, wherein the drive device is configured to drive each of the plurality of the first inner conductors in the direction of the tube axis in an independent manner.

6. The antenna device according to claim 1, further comprising:
   a fourth waveguide; and
   a second inner conductor,
   wherein the fourth waveguide is connected to the lower wall on the dielectric window side and communicates with the first waveguide,
   the second inner conductor extends along the direction of the tube axis from the inside of the first waveguide to an inside of the fourth waveguide,
   a third end of the second inner conductor is in contact with the dielectric window through a second opening end of the fourth waveguide,
   the second opening end is connected to the dielectric window, and
   a fourth end of the second inner conductor is in contact with the upper wall.

7. The antenna device according to claim 1, further comprising:
a fourth waveguide; and
a second inner conductor,
wherein the fourth waveguide is connected to the lower wall on the dielectric window side and communicates with the first waveguide,
the second inner conductor penetrates the upper wall, is electrically connected with the upper wall, and extends along the direction of the tube axis from the inside of the first waveguide to an inside of the fourth waveguide,
a third end of the second inner conductor is positioned at a center of the fourth waveguide, in a surface crossing the tube axis,
a second opening end of the fourth waveguide is connected to the dielectric window, and
the drive device is connected to the second inner conductor, and is configured to drive the second inner conductor in the direction of the tube axis.

8. The antenna device according to claim 7, wherein the drive device is configured to change a gap between the third end of the second inner conductor and the dielectric window by driving the second inner conductor in the direction of the tube axis.

9. The antenna device according to claim 7,
wherein a plurality of the fourth waveguides and a plurality of the second inner conductors are provided, and
the plurality of the fourth waveguides and the plurality of the second inner conductors are disposed in a concentric circular shape when viewed from the tube axis.

10. The antenna device according to claim 9, wherein the drive device is configured to drive each of the plurality of the second inner conductors in the direction of the tube axis in a synchronization manner.

11. The antenna device according to claim 9, wherein the drive device is configured to drive each of the plurality of the second inner conductors in the direction of the tube axis in an independent manner.

12. The antenna device according to claim 1,
wherein the first waveguide includes a dispersion part and a coaxial conversion part,
the dispersion part is disposed on the tube axis and on the lower wall in the first waveguide, and disperses electromagnetic waves guided along the tube axis by the second waveguide in the direction crossing the tube axis in the first waveguide, and
the coaxial conversion part is included in the first inner conductor in the first waveguide, and causes propagation of the electromagnetic waves which are dispersed by the dispersion part and reach the first inner conductor to be directed toward the dielectric window.

13. The antenna device according to claim 6,
wherein the first waveguide includes a dispersion part and a coaxial conversion part,
the dispersion part is disposed on the tube axis and on the lower wall in the first waveguide, and disperses electromagnetic waves guided along the tube axis by the second waveguide in the direction crossing the tube axis in the first waveguide, and
the coaxial conversion part is included in at least one of the first inner conductor and the second inner conductor in the first waveguide, and causes propagation of the electromagnetic waves which are dispersed by the dispersion part and reach the first inner conductor or the second inner conductor including the coaxial conversion part to be directed toward the dielectric window.

14. The antenna device according to claim 1, further comprising:
a probe group,
wherein the probe group includes a plurality of probes which are electric conductors, is provided in the first waveguide or the third waveguide, and is used to detect a physical quantity that is used for plasma generation and is present around the first waveguide or the third waveguide, and
the plurality of the probes are disposed in a concentric circular shape when viewed from the tube axis.

15. The antenna device according to claim 6, further comprising:
a probe group,
wherein the probe group includes a plurality of probes which are electric conductors, is provided in the first waveguide, the third waveguide, or the fourth waveguide, and is used to detect a physical quantity that is used for plasma generation and is present around the first waveguide, the third waveguide, or the fourth waveguide, and
the plurality of the probes are disposed in a concentric circular shape when viewed from the tube axis.

16. The antenna device according to claim 14, further comprising:
an arithmetic device,
wherein the arithmetic device is configured to acquire a distribution of the physical quantity on the basis of a plurality of values of the physical quantity detected by the probe group.

17. The antenna device according to claim 16, wherein the arithmetic device is configured to control the drive device on the basis of the acquired distribution of the physical quantity.

18. A plasma processing apparatus comprising: the antenna device according to claim 1.

* * * * *